US011831285B2

United States Patent
Chang

(10) Patent No.: US 11,831,285 B2
(45) Date of Patent: Nov. 28, 2023

(54) LOAD CIRCUIT OF AMPLIFIER AND DRIVER CIRCUIT FOR SUPPORTING MULTIPLE INTERFACE STANDARDS

(71) Applicant: M31 TECHNOLOGY CORPORATION, Hsinchu County (TW)

(72) Inventor: Ching-Hsiang Chang, Hsinchu County (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 632 days.

(21) Appl. No.: 17/077,771

(22) Filed: Oct. 22, 2020

(65) Prior Publication Data
US 2021/0067113 A1     Mar. 4, 2021

Related U.S. Application Data

(62) Division of application No. 16/264,928, filed on Feb. 1, 2019, now Pat. No. 10,886,882.

(51) Int. Cl.
*H04B 1/10*     (2006.01)
*H03F 3/45*     (2006.01)
(Continued)

(52) U.S. Cl.
CPC ......... *H03F 3/45179* (2013.01); *H03K 3/038* (2013.01); *H03K 19/017509* (2013.01);
(Continued)

(58) Field of Classification Search
CPC ............... H03F 3/45179; H03K 3/038; H03K 19/017509; H03K 19/018528; H04B 1/04; H04B 1/16; H04N 7/04
See application file for complete search history.

(56) References Cited

U.S. PATENT DOCUMENTS 5,142,219 A * 8/1992 Hsu ...................... H03F 3/45192
                                                              323/317
8,228,271 B2 * 7/2012 Hirai ...................... G09G 3/325
                                                              345/82
(Continued)

FOREIGN PATENT DOCUMENTS

CN     103780242 A     5/2014
CN     104300956 A     1/2015

OTHER PUBLICATIONS

Notice of Allowance and Search Report dated Nov. 22, 2021 issued by the China National Intellectual Property Administration for the Chinese Counterpart Application No. 201910530168.6.
(Continued)

*Primary Examiner* — Kurtis R Bahr
(74) *Attorney, Agent, or Firm* — WPAT, P.C., INTELLECTUAL PROPERTY ATTORNEYS; Anthony King

(57) ABSTRACT

A driver circuit includes a first output terminal, a first switch, a second switch, a third switch and a power source. The first output terminal is arranged for outputting a data output. The first switch is selectively coupled between the first output terminal and a power supply node according to a data input. The second switch is selectively coupled between the first output terminal and a first reference node according to the data input. The third switch is selectively coupled between the first reference node and a reference voltage. The power source is configured to selectively provide one of a supply voltage signal and a supply current signal to the power supply node. When the power source is configured to provide the supply voltage signal, the third switch is switched on. When the power source is configured to provide the supply current signal, the third switch is switched off.

20 Claims, 16 Drawing Sheets

(51) Int. Cl.
  *H03K 3/038* (2006.01)
  *H03K 19/0175* (2006.01)
  *H03K 19/0185* (2006.01)
  *H04B 1/04* (2006.01)
  *H04B 1/16* (2006.01)
  *H04N 7/04* (2006.01)

(52) U.S. Cl.
  CPC ....... *H03K 19/018528* (2013.01); *H04B 1/04* (2013.01); *H04B 1/16* (2013.01); *H04N 7/04* (2013.01)

(56) References Cited

U.S. PATENT DOCUMENTS

| | | | | |
|---|---|---|---|---|
| 9,590,610 | B2* | 3/2017 | Luo | H03K 17/10 |
| 2003/0020439 | A1* | 1/2003 | Engl | G05F 1/56 |
| | | | | 323/280 |
| 2009/0203333 | A1* | 8/2009 | Jeffries | H04L 25/028 |
| | | | | 375/295 |
| 2013/0076404 | A1* | 3/2013 | Lee | H03K 17/002 |
| | | | | 327/108 |
| 2019/0296692 | A1* | 9/2019 | Patel | G05F 1/56 |
| 2020/0197689 | A1* | 6/2020 | Dernebo | A61N 1/3603 |

OTHER PUBLICATIONS

English Abstract Translations of CN103780242A and CN104300956A.

* cited by examiner

# LOAD CIRCUIT OF AMPLIFIER AND DRIVER CIRCUIT FOR SUPPORTING MULTIPLE INTERFACE STANDARDS

PRIORITY CLAIM AND CROSS-REFERENCE

The present application is a divisional application of U.S. patent application Ser. No. 16/264,928 filed on Feb. 1, 2019, which is incorporated herein by reference in its entirety.

BACKGROUND

The present disclosure relates to circuits for supporting multiple interface standards and, more particularly, to a load circuit of an amplifier and a driver circuit for supporting multiple interface standards.

High-speed interfaces are developed to handle large volumes of data transmitted between and inside electronic devices. For example, high-speed interfaces are adopted to connect image sensors and high resolution displays since high resolution images involve large amounts of data. Also, high-speed interfaces with low power consumption are widely used in portable electronic devices to extend battery life. One example of the high-speed interfaces with low power consumption is subLVDS, which is a subset of the low-voltage differential signaling (LVDS) standard. The subLVDS can transmit image data over long distances. Another example of the high-speed interfaces with low power consumption is MIPI D-PHY, defined by the Mobile Industry Processor Interface (MIPI) standard. The MIPI D-PHY specifies a relatively low common mode voltage.

SUMMARY

The described embodiments provide a load circuit of an amplifier in a receiver supporting multiple interface standards, and a driver circuit in a transmitter supporting multiple interface standards.

Some embodiments described herein may include a load circuit of an amplifier. The load circuit includes a first resistive element, a first transistor and a tristate control circuit. The first transistor has a first control terminal, a first connection terminal and a second connection terminal. The first connection terminal is coupled to one of a first amplifier output terminal of the amplifier and a first connection node. The second connection terminal is coupled to the other of the first amplifier output terminal and the first connection node. The tristate control circuit has a signal output terminal coupled to the first control terminal. The tristate control circuit is configured to set the signal output terminal to one of a low impedance state and a high impedance state. When the signal output terminal is in the low impedance state, the first control terminal is arranged to receive a first control signal outputted from the signal output terminal. When the signal output terminal is in the high impedance state, the first control terminal is arranged to receive a second control signal different from the first control signal.

Some embodiments described herein may include a load circuit of an amplifier. The load circuit includes a first transistor, a second transistor, a first resistive element, a second resistive element and a tristate control circuit. The first transistor has a first control terminal, a first connection terminal and a second connection terminal. The second connection terminal is coupled to a reference voltage. The second transistor has a second control terminal, a third connection terminal and a fourth connection terminal. The fourth connection terminal is coupled to the reference voltage. The first resistive element is coupled between a first amplifier output terminal of the amplifier and the first connection terminal. The second resistive element is coupled between a second amplifier output terminal of the amplifier and the third connection terminal. The tri state control circuit has a signal output terminal coupled to each of the first control terminal and the second control terminal. The tristate control circuit is configured to set the signal output terminal to one of a low impedance state and a high impedance state.

Some embodiments described herein may include a driver circuit for receiving a data input to generate a data output. The driver circuit includes a first output terminal, a first switch, a second switch, a third switch and a power source. The first output terminal is arranged for outputting the data output. The first switch is selectively coupled between the first output terminal and a power supply node according to the data input. The second switch is selectively coupled between the first output terminal and a first reference node according to the data input. The third switch is selectively coupled between the first reference node and a reference voltage. The power source is configured to selectively provide one of a supply voltage signal and a supply current signal to the power supply node. When the power source is configured to provide the supply voltage signal, the third switch is switched on. When the power source is configured to provide the supply current signal, the third switch is switched off.

Some embodiments described herein may include a driver circuit for receiving a data input to generate a data output. The driver circuit includes a pair of differential output terminals, a power source, a first switch, a second switch, a third switch, a fourth switch, a fifth switch and a sixth switch. The pair of differential output terminals is arranged for outputting the data output. The pair of differential output terminals has a first output terminal and a second output terminal. The power source is configured to selectively provide one of a supply voltage signal and a supply current signal to a power supply node according to a power switch signal. The first switch is selectively coupled between the first output terminal and the power supply node according to the data input. The second switch is selectively coupled between the first output terminal and a first reference node according to the data input. The third switch is selectively coupled between the first reference node and a reference voltage according to the power switch signal. The fourth switch is selectively coupled between the second output terminal and the power supply node according to the data input. The fifth switch is selectively coupled between the second output terminal and a second reference node according to the data input. The sixth switch is selectively coupled between the second reference node and the reference voltage.

With the use of a data transmission/reception scheme which supports multiple interface standards, a signal processing device such as an ISP chip can meet different common-mode voltage specifications at both a receiver side and a transmitter side. Also, compared with a signal processing device employing dedicated circuits for different interface standards, the signal processing device utilizing the proposed data transmission/reception scheme can have a relatively small circuit area, thereby reducing manufacturing costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
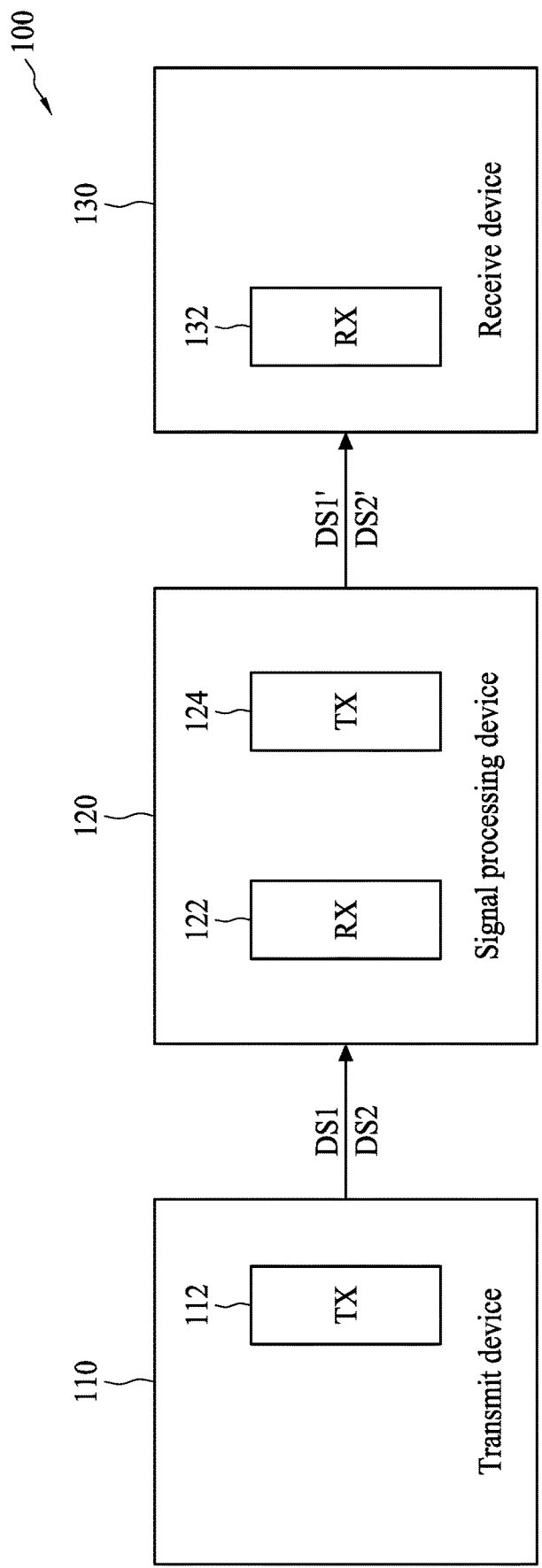
FIG. 1 is a block diagram illustrating an exemplary electronic system in accordance with some embodiments of the present disclosure.

The following disclosure provides many different embodiments, or examples, for implementing different features of the provided subject matter. Specific examples of parameter values, and arrangements are described below to simplify the present disclosure. These are, of course, merely examples and are not intended to be limiting. For example, parameter values in the description that follows may vary depending on a given technology node such as an advanced CMOS technology node, an advanced FinFET technology node or other semiconductor technology nodes. As another example, parameter values for a given technology node may vary depending on a given application or operating scenario. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

As different high-speed interfaces have different interface standards/specifications, separate circuits dedicated to different interface standards respectively may be disposed in a same transmitter/receiver in order to support the different interface standards. For example, a receiver would employ two separate circuits respectively dedicated to subLVDS and MIPI-DHY in order to meet respective common-mode voltage specifications, which however causes increased circuit areas and costs.

The present disclosure describes exemplary load circuits for an amplifier, each of which can serve as a portion of a receiver front-end circuit supporting multiple interface standards including, for example, at least one of subLVDS standard, MIPI D-PHY standard, High Definition Multimedia Interface (HDMI) standard, DisplayPort (DP) interface standard and other high-speed interface standards. In some embodiments, with the use of a tristate control circuit, the exemplary load circuits can adjust a voltage drop across a transistor switch in response to different interface standards, thus meeting different common-mode voltage specifications.

The present disclosure further describes exemplary driver circuits, each of which can serve as a portion of a transmitter front-end circuit supporting multiple interface standards including, for example, at least one of subLVDS standard, MIPI D-PHY standard and other high-speed interface standards. In some embodiments, with the use of a power source capable of acting as a voltage source and a current source, the exemplary driver circuits can act as a voltage mode driver or a current mode driver according to different operating scenarios, thereby adjusting a voltage signal level at an output terminal to meet different common-mode voltage specifications.

FIG. 1 is a block diagram illustrating an exemplary electronic system 100 in accordance with some embodiments of the present disclosure. The electronic system 100 can be implemented as various types of signal transmission systems, such as an image signal transmission system, an audio signal transmission system, a multimedia signal transmission, an electronic signal transmission system or an optical signal transmission system. The electronic system 100 may include, but is not limited to, transmit device 110, a signal processing device 120 and a receive device 130. By way of example but not limitation, the electronic system 100 can be implemented to perform image data transmission. The transmit device 110 may be implemented by an image data source such as an image pickup device or an image sensor. The signal processing device 120 may be implemented by an image signal processor (ISP) or an application-specific integrated circuit (ASIC) in a chip. The receive device 130 may be implemented by an image data sink such as a display device.

In the present embodiment, the signal processing device 120 can utilize a receiver circuit (labeled RX) 122 and a transmitter circuit (labeled TX) 124 to communicate with the transmit device 110 and the receive device 130, respectively. It is worth noting that the receiver circuit 122 may be operating in different operating modes in response to different interface standards. As a result, the signal processing device 120 can communicate with the transmit device 110 in accordance with the different interface standards. For example, when a transmitter circuit (labeled TX) 112 of the transmit device 110 is configured to transmit a data signal DS1 compliant with an interface standard, the receiver circuit 122 of the signal processing device 120 can be configured to operate in an operating mode to receive the data signal DS1 compliant with the same interface standard. When the transmitter circuit 112 is configured to transmit a data signal DS2 compliant with another interface standard different from the interface standard, the receiver circuit 122 can be configured to operate in another operating mode to receive the data signal DS2 compliant with the another same interface standard. Compared with a signal processing device utilizing dedicated receiver circuits for receiving respective data signals compliant with different interface standards, the signal processing device 120 can have a relatively small circuit area since these data signals can be successfully received by the shared receiver circuit 122.

Additionally or alternatively, with the use of the transmitter circuit 124 operating in different operating modes in response to different interface standards, the signal processing device 120 can communicate with the receive device 130 in accordance with the different interface standards. For example, when a receiver circuit 132 (labeled RX) of the receive device 130 is configured to receive a data signal DS1' compliant with an interface standard, the transmitter circuit 124 of the signal processing device 120 can be configured to operate in an operating mode to transmit the data signal DS1' compliant with the same interface standard. When the receiver circuit 132 is configured to receive a data signal DS2' compliant with another interface standard different from the interface standard, the transmitter circuit 124 can be configured to operate in another operating mode to transmit the data signal DS2' compliant with the another same interface standard. Compared with a signal processing device utilizing dedicated transmitter circuits for transmitting respective data signals compliant with different interface standards, the signal processing device 120 can have a relatively small circuit area since the shared transmitter circuit 124 can be configured to transmit these data signals.

Please note that, in some embodiments, the transmitter circuit 112 of the transmit device 110 can be configured to operate in different operating modes in response to different interface standards. As a result, the transmit device 110 can communicate with the signal processing device 120 according to the different interface standards with the use of the transmitter circuit 112 rather than more than one dedicated transmitter circuit. For example, when the receiver circuit 122 of the signal processing device 120 is configured to receive the data signal DS1 compliant with an interface standard, the transmitter circuit 112 of the transmit device 110 can be configured to operate in an operating mode to transmit the data signal DS1 compliant with the same interface standard. When the receiver circuit 122 is configured to receive the data signal DS2 compliant with another interface standard different from the interface standard, the transmitter circuit 112 can be configured to operate in another operating mode to transmit the data signal DS2 compliant with the another same interface standard.

Similarly, in some embodiments, the receiver circuit 132 of the receive device 130 can be configured to operate in different operating modes in response to different interface standards. As a result, the receive device 130 can communicate with the signal processing device 120 according to the different interface standards with the use of the receiver circuit 132 rather than more than one dedicated receiver circuit. For example, when the transmitter circuit 124 of the signal processing device 120 is configured to transmit the data signal DS1' compliant with an interface standard, the receiver circuit 132 of the receive device 130 can be configured to operate in an operating mode to receive the data signal DS1' compliant with the same interface standard. When the transmitter circuit 124 is configured to transmit the data signal DS2' compliant with another interface standard different from the interface standard, the receiver circuit 132 can be configured to operate in another operating mode to receive the data signal DS2' compliant with the another same interface standard.

For illustrative purposes, the proposed signal reception/transmission scheme capable of supporting multiple interface standards is described below with reference to the signal processing device 120 shown in FIG. 1. However, this is not intended to limit the scope of the present disclosure. Those skilled in the art will recognize that the proposed signal reception/transmission scheme may be applied to at least one of the transmit device 110 shown in FIG. 1, the receive device 130 shown in FIG. 1, and other devices having transmitter/receiver circuits.

Figure 2:
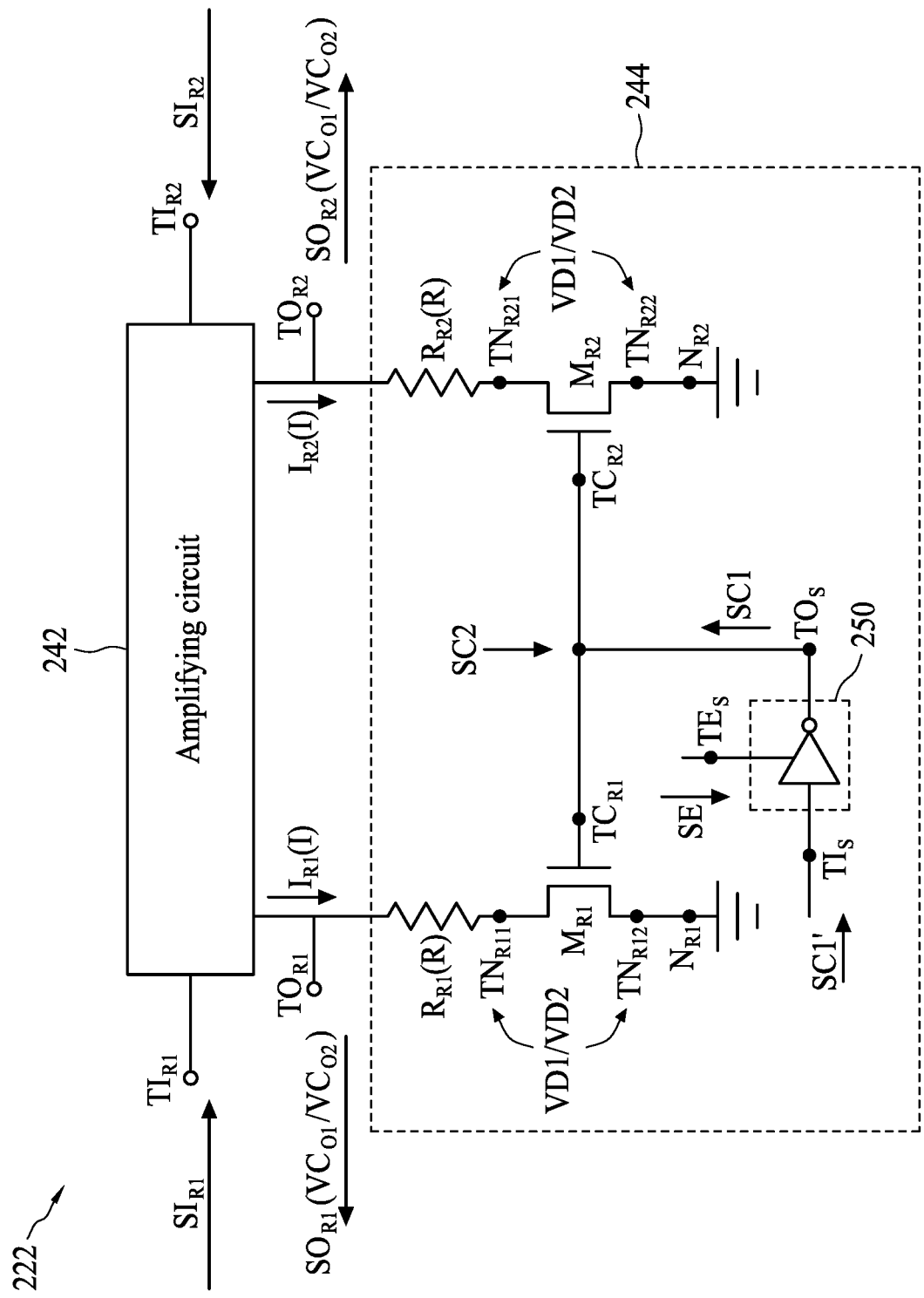
FIG. 2 illustrates an implementation of at least a portion of the receiver circuit shown in FIG. 1 in accordance with some embodiments of the present disclosure.

Firstly, referring to FIG. 2, an implementation of at least a portion of the receiver circuit 122 shown in FIG. 1 is illustrated in accordance with some embodiments of the present disclosure. The amplifier 222 can be, but is not limited to, an embodiment of a front-end circuit of the receiver circuit 122 shown in FIG. 1. In the present embodiment, the amplifier 222 can be implemented as a differential amplifier, which includes a pair of amplifier input terminals $TI_{R1}$ and $TI_{R2}$, a pair of amplifier output terminals $TO_{R1}$ and $TO_{R2}$, an amplifying circuit 242 and a load circuit 244. The amplifier input terminals $TI_{R1}$ and $TI_{R2}$ are configured to receive a pair of differential input signals $SI_{R1}$ and $SI_{R2}$, which can be an embodiment of the data signal DS1/DS2 shown in FIG. 1. The amplifier output terminals $TO_{R1}$ and $TO_{R2}$ are configured to output a pair of differential output signals $SO_{R1}$ and $SO_{R2}$. The amplifying circuit 242, coupled to the amplifier input terminals $TI_{R1}$ and $TI_{R2}$ and the amplifier output terminals $TO_{R1}$ and $TO_{R2}$, can be implemented by a differential pair, which is configured to provide a pair of differential current signals $I_{R1}$ and $I_{R2}$, in response to the differential input signals $SI_{R1}$ and $SI_{R2}$.

The load circuit 244, coupled to the amplifier output terminals $TO_{R1}$ and $TO_{R2}$, is configured to produce the output signals $SO_{R1}$ and $SO_{R2}$ in response to the current signals $I_{R1}$ and $I_{R2}$. The load circuit 244 includes, but is not limited to, a plurality of transistors $M_{R1}$ and $M_{R2}$, a plurality of resistive elements $R_{R1}$ and $R_{R2}$, and a tristate control circuit 250. The transistor $M_{R1}$ has a control terminal $TC_{R1}$, a connection terminal $TN_{R11}$ and a connection terminal $TN_{R12}$. The transistor $M_{R2}$ has a control terminal $TC_{R2}$, a connection terminal $TN_{R21}$ and a connection terminal $TN_{R22}$. One connection terminal of the transistor $M_{R1}/M_{R2}$ is coupled to one of an amplifier output terminal and a connection node through a corresponding resistive element, while another connection terminal of the transistor $M_{R1}/M_{R2}$ is coupled to the other of the amplifier output terminal and the connection node. In the present embodiment, the connection terminal $TN_{R11}$ of the transistor $M_{R1}$ is coupled to the amplifier output terminal $TO_{R1}$ through the resistive element $R_{R1}$, and the connection terminal $TN_{R12}$ of the transistor $M_{R1}$ is coupled to a connection node $N_{R1}$. Also, the connection terminal $TN_{R21}$ of the transistor $M_{R2}$ is coupled to the amplifier output terminal $TO_{R2}$ through the resistive element $R_{R2}$, and the connection terminal $TN_{R22}$ of the transistor $M_{R2}$ is coupled to a connection node $N_{R2}$. Each of the connection node $N_{R1}$ and the connection node $N_{R2}$ can be coupled to a ground voltage. However, those skilled in the art should appreciate that the connection node $N_{R1}/N_{R2}$ can be coupled to other reference voltages or other circuit elements without departing from the scope of the present disclosure.

The resistive element $R_{R1}$ is coupled between the amplifier output terminal $TO_{R1}$ and the connection terminal $TN_{R11}$. The resistive element $R_{R2}$ is coupled between the amplifier output terminal $TO_{R2}$ and the connection terminal $TN_{R21}$. The tristate control circuit 250 has a tristate enable terminal $TE_S$, a signal input terminal $TI_S$ and a signal output terminal $TO_S$, wherein the signal output terminal $TO_S$ is coupled to each of the control terminals $TC_{R1}$ and $TC_{R2}$. The tristate control circuit 250 is configured to set the signal output terminal $TO_S$ to one of a low impedance state and a high impedance state according to a tristate enable signal SE inputted to the tristate enable terminal $TE_S$. By way of example but not limitation, when the signal output terminal $TO_S$ is in the low impedance state, the control terminal $TC_{R1}/TC_{R2}$ is arranged to receive a control signal SC1 outputted from the signal output terminal $TC_{R1}$. A voltage signal at the amplifier output terminal $TO_{R1}/TO_{R2}$ can be determined by the control signal SC1 outputted by the tristate control circuit 250. When the signal output terminal $TO_S$ is in the high impedance state, the control terminal $TC_{R1}/TC_{R2}$ is arranged to receive a control signal SC2 different from the control signal SC1. The voltage signal at the amplifier output terminal $TO_{R1}/TO_{R2}$ can be determined by the control signal SC2 inputted to the control terminal $TC_{R1}/TC_{R2}$.

In the present embodiment, the tristate control circuit 250 may be implemented as a tristate inverter. When the signal output terminal $TO_S$ is set to the low impedance state, the tristate control circuit 250 can be configured to invert a control signal SC1' to generate the control signal SC1. However, this is not intended to limit the scope of the present disclosure. It is also feasible to utilize other types of tristate control circuits, such as a tristate buffer, to selectively provide the control signal SC1 to the control terminal $TC_{R1}/TC_{R2}$.

In operation, the input signals $SI_{R1}$ and $SI_{R2}$ may be transmitted to the amplifier 222 in accordance with a first interface standard, which specifies a first common-mode input voltage range of the input signals $SI_{R1}$ and $SI_{R2}$. To successfully receive the input signals $SI_{R1}$ and $SI_{R2}$ compliant with the first interface standard, the amplifier 222 may operate in a first operating mode to ensure that the output signals $SO_{R1}$ and $SO_{R2}$ will have a suitable common-mode output voltage. For example, in the first operating mode, the tristate control circuit 250 may set the signal output terminal $TO_S$ to the low impedance state according to the tristate enable signal SE. Also, the tristate control circuit 250 may output the control signal SC1 to turn on the transistors $M_{R1}$ and $M_{R2}$, thus creating a voltage drop VD1 across the connection terminals $TN_{R11}$ and $TN_{R12}$ and across the connection terminals $TN_{R21}$ and $TN_{R22}$. In some cases where each of the connection nodes $N_{R1}$ and $N_{R2}$ is coupled to a ground voltage, the output signals $SO_{R1}$ and $SO_{R2}$ may have a common-mode output voltage $VC_{O1}$ which can be expressed by the following equation, where I represents a common-mode current of the current signal $I_{R1}/I_{R2}$, and R represents a resistance of the resistive element $R_{R1}/R_{R2}$.

$$VC_{O1}=I \times R+VD1$$

When input signals $SI_{R1}$ and $SI_{R2}$ are transmitted to the amplifier 222 in accordance with a second interface standard, which specifies a second common-mode input voltage range of the input signals $SI_{R1}$ and $SI_{R2}$, the amplifier 222 may operate in a second operating mode to ensure that the output signals $SO_{R1}$ and $SO_{R2}$ will have a suitable common-mode output voltage for matching the second common-mode input voltage range. For example, in the second operating mode, the tristate control circuit 250 may set the signal output terminal $TO_S$ to the high impedance state according to the tristate enable signal SE. When the signal output terminal $TO_S$ enters the high impedance state, the transistors $M_{R1}$ and $M_{R2}$ is controlled by the control signal SC2 rather than the control signal SC1, thus creating a voltage drop VD2 cross the connection terminals $TN_{R11}$ and $TN_{R12}$ and across the connection terminals $TN_{R21}$ and $TN_{R22}$. In some cases where each of the connection nodes $N_{R1}$ and $N_{R2}$ is coupled to a ground voltage, the output signal $SO_{R1}/SO_{R2}$ may have a common-mode output voltage $VC_{O2}$ which can be expressed by the following equation.

$$VC_{O2}=I \times R+VD2$$

As a voltage drop across two connection terminals of a transistor, such as drain and source terminals, changes in response to a signal level at a control terminal thereof, the voltage drop VD1 in the first operating mode is different from the voltage drop VD2 in the second operating mode because respective signal levels of the control signal SC1 and the control signal SC2 inputted to the control terminal $TC_{R1}/TC_{R2}$ are different. As a result, the load circuit 244 can dynamically adjust a voltage drop across the transistor $M_{R1}/M_{R2}$ with the use of the tristate control circuit 250, thereby meeting different requirements specified in different interface standards.

To facilitate understanding of the present disclosure, some embodiments are given as follows for further description of the signal reception scheme. Those skilled in the art should appreciate that other embodiments employing the amplifier 222 shown in FIG. 2 are also within the contemplated scope of the present disclosure.

Figure 3:
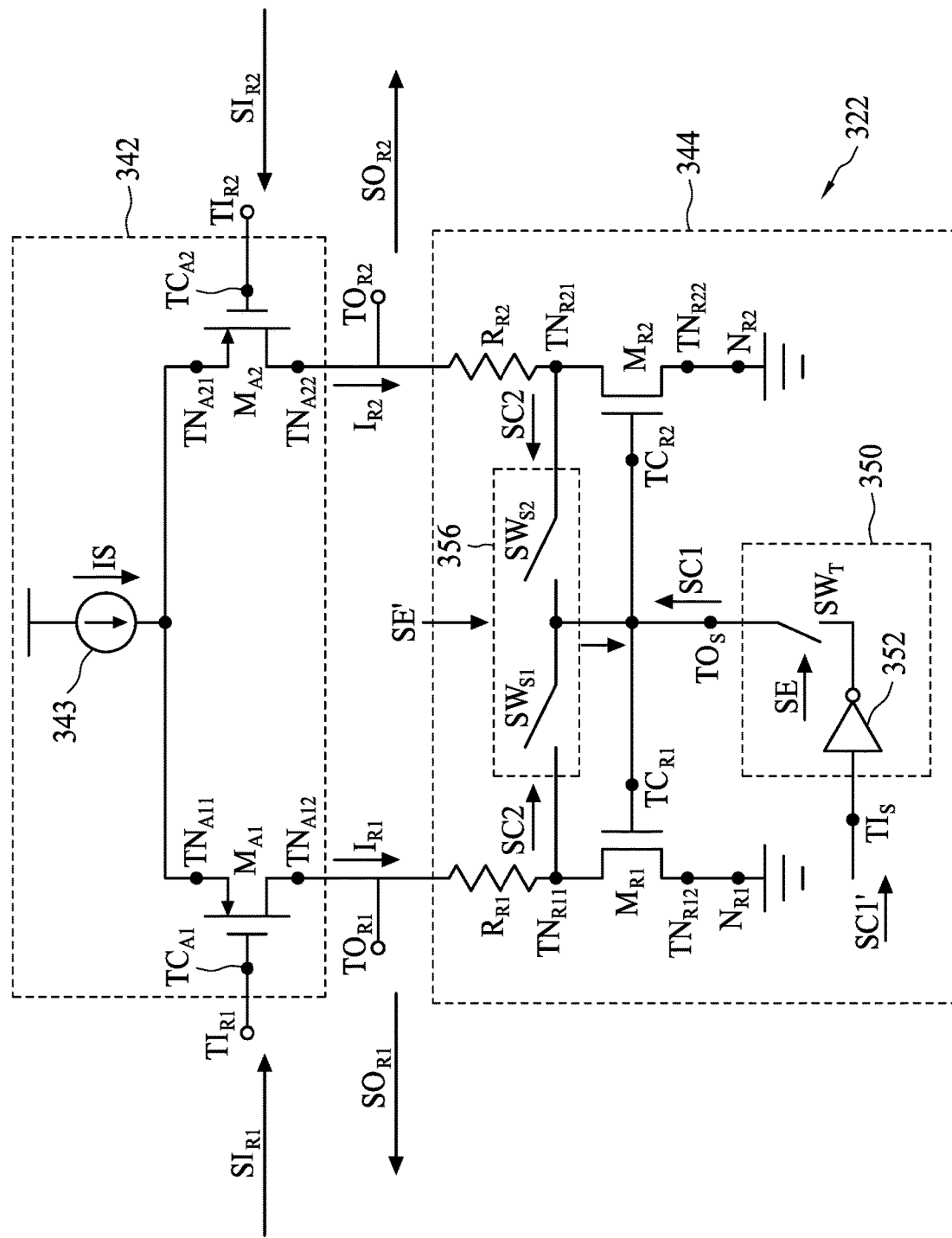
FIG. 3 illustrates an implementation of the amplifier shown in FIG. 2 in accordance with some embodiments of the present disclosure.

FIG. 3 illustrates an implementation of the amplifier 222 shown in FIG. 2 in accordance with some embodiments of the present disclosure. In the present embodiment, the amplifier 322 includes an amplifying circuit 342 and a load circuit 344. The amplifying circuit 342 can be implemented as a differential pair, including but not limited to a current source 343 and a pair of transistors $M_{A1}$ and $M_{A2}$. The current source 343 is configured to provide a current signal IS. The transistor $M_{A1}$ has a control terminal $TC_{A1}$, a connection terminal $TN_{A11}$ and a connection terminal $TN_{A12}$, which are coupled to the input terminal $TI_{R1}$, the current source 343 and the output terminal $TO_{R1}$ respectively. The transistor $M_{A2}$ has a control terminal $TC_{A2}$, a connection terminal $TN_{A21}$ and a connection terminal $TN_{A22}$, which are coupled to the input terminal $TI_{R2}$, the current source 343 and the output terminal $TO_{R2}$ respectively. Those skilled in the art will recognize that the amplifying circuit 342 may be implemented by other types of amplifying circuits or differential pairs without departing from the scope of the present disclosure.

The load circuit 344 may include the transistors $M_{R1}$ and $M_{R2}$ shown in FIG. 2, the resistive elements $R_{R1}$ and $R_{R2}$ shown in FIG. 2, a tristate control circuit 350 and a switch circuit 356. The tristate control circuit 350 can be implemented by a tristate inverter including but not limited to an inverter 352 and a switch $SW_T$. The inverter 352 is selectively coupled to the signal output terminal $TO_S$ through the switch $SW_T$ according to the tristate enable signal SE. In the present embodiment, the switch $SW_T$ can be controlled by the tristate enable signal SE. When the switch $SW_T$ is switched on according to the tristate enable signal SE, the signal output terminal $TO_S$ is in the low impedance state. When the switch $SW_T$ is switched off according to the tristate enable signal SE, the signal output terminal $TO_S$ is in the high impedance state.

The switch circuit 356 is configured to selectively couple the control signal SC2 to each of the control terminals $TC_{R1}$ and $TC_{R2}$. When the signal output terminal $TO_S$ is in the low impedance state, the switch circuit 356 is configured to disconnect the control signal SC2 from the control terminal $TC_{R1}/TC_{R2}$. When the signal output terminal $TO_S$ is in the high impedance state, the switch circuit 356 is configured to couple the control signal SC2 to the control terminal $TC_{R1}/TC_{R2}$. As a result, when the signal output terminal $TO_S$ is in the low impedance state, a voltage signal at the amplifier output terminal $TO_{R1}/TO_{R2}$ can be determined by the control signal SC1 outputted by the tristate control circuit 350. When the signal output terminal $TO_S$ is in the high impedance state, the voltage signal at the amplifier output terminal $TO_{R1}/TO_{R2}$ can be determined by the control signal SC2 inputted to the control terminal $TC_{R2}/TC_{R2}$.

In the present embodiment, the control signal SC2 can be, but is not limited to, a voltage signal at at least one of the connection terminals $TN_{R11}$ and $TN_{R21}$. The switch circuit 356 is configured to selectively couple the connection terminal $TN_{R11}$ to the control terminal $TC_{R1}$. For example, the switch circuit 356 may include a switch $SW_{S1}$, which is selectively coupled between the connection terminal $TN_{R11}$ and the control terminal $TC_{R1}$. When the signal output terminal $TO_S$ is in the low impedance state, the switch $SW_{S1}$ is switched off. When the signal output terminal $TO_S$ is in the high impedance state, the switch $SW_{S1}$ is switched on. By way of example but not limitation, the switch $SW_T$ can be controlled by the tristate enable signal SE, while the switch $SW_{S1}$ can be controlled by an inverted signal SE' of the tristate enable signal SE.

Additionally or alternatively, the switch circuit 356 can also be configured to selectively couple the connection terminal $TN_{R21}$ to the control terminal $TC_{R2}$. For example, the switch circuit 356 may include a switch $SW_{S2}$, which is selectively coupled between the connection terminal $TN_{R21}$ and the control terminal $TC_{R2}$. When the signal output terminal $TO_S$ is in the low impedance state, the switch $SW_{S2}$ is switched off. When the signal output terminal $TO_S$ is in the high impedance state, the switch $SW_{S2}$ is switched on. By way of example but not limitation, the switch $SW_T$ can be controlled by the tristate enable signal SE, while the switch $SW_{S2}$ can be controlled by the inverted signal SE' of the tristate enable signal SE.

Advantages of the load circuit 344 are described with reference to subLVDS standard and MIPI D-PHY standard in the following embodiments. However, this is for illustrative purposes only, and is not intended to be a limitation of the present disclosure. The load circuits disclosed in the present disclosure are applicable to, but not limited to, multiple interface standards in addition to subLVDS standard and MIPI-PHY standard.

Figure 4A:
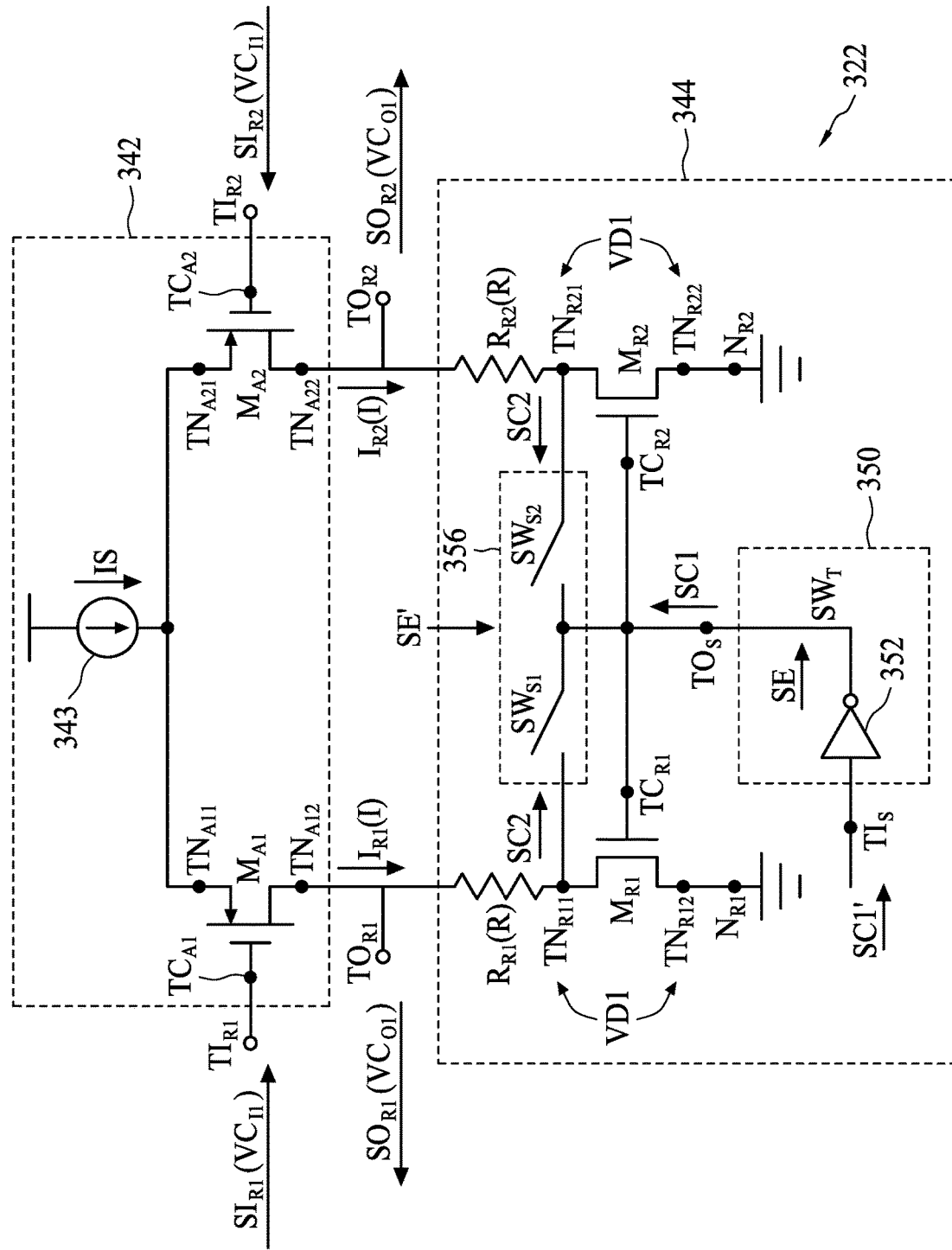
FIG. 4A is a diagram illustrating exemplary operation in a first operating mode of the amplifier shown in FIG. 3 in accordance with some embodiments of the present disclosure.

FIG. 4A is a diagram illustrating exemplary operation in a first operating mode of the amplifier 322 shown in FIG. 3 in accordance with some embodiments of the present disclosure. In the present embodiment, the first operating mode can be, but is not limited to, a MIPI D-PHY mode. The common-mode input voltage $VC_{11}$ may be equal to 0.2 volt, a nominal common-mode voltage specified in MIPI D-PHY standard. In operation, the switch $SW_T$ is switched on, while each of the switches $SW_{S1}$ and $SW_{S2}$ is switched off. As the control signal SC1 inputted to the control terminal $TC_{R1}$ has a sufficient signal level, the voltage drop VD1 is equal to or substantially equal to zero. The common-mode output voltage $VC_{O1}$, matching the common-mode input voltage $VC_{11}$, is equal to a product of the common-mode current of the current signal $I_{R1}$ and the resistance of the resistive element $R_{R1}$, i.e. I×R.

Figure 4B:
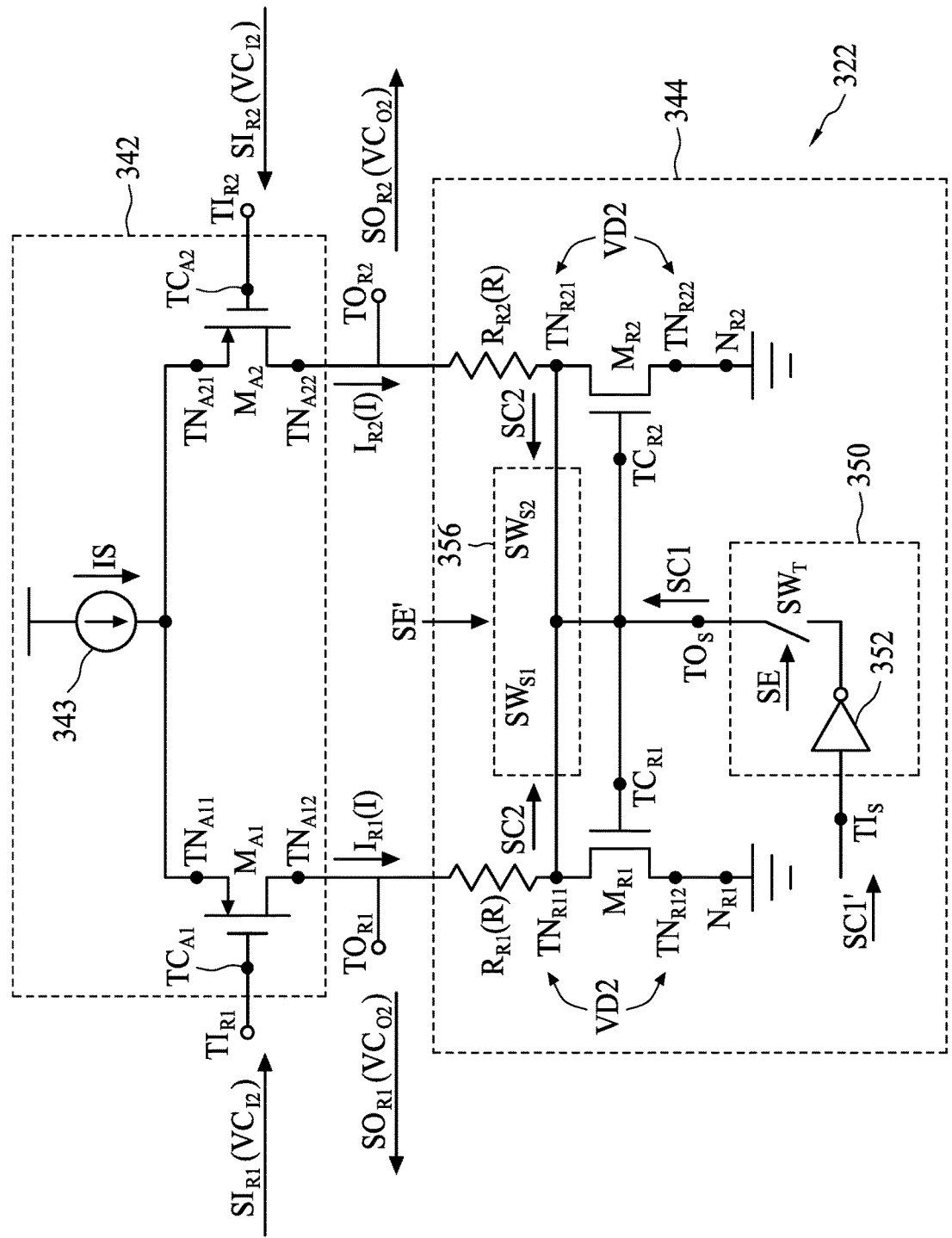
FIG. 4B is a diagram illustrating exemplary operation in a second operating mode of the amplifier shown in FIG. 3 in accordance with some embodiments of the present disclosure.

Referring to FIG. 4B, exemplary operation in a second operating mode of the amplifier 322 shown in FIG. 3 is illustrated in accordance with some embodiments of the present disclosure. In the present embodiment, the second operating mode can be, but is not limited to, a subLVDS mode. The common-mode input voltage $VC_{12}$ may be equal to 0.9 volt, a nominal common-mode input voltage specified in the subLVDS standard. To match the common-mode input voltage $VC_{12}$, the amplifier 322 is configured to provide the common-mode output voltage $VC_{O2}$ which is 0.7 volt greater than the common-mode output voltage $VC_{O1}$. In operation, the switch $SW_T$ is switched off, while each of the switches $SW_{S1}$ and $W_{S2}$ is switched on. As a result, the connection terminal $TN_{R11}$ is connected to the control terminal $TC_{R1}$ to form a diode-connected transistor, and the connection terminal $TN_{R21}$ is also connected to the control terminal $TC_{R2}$ to form a diode-connected transistor. The common-mode output voltage $VC_{O2}$ can be expressed as I×R+Vth, i.e. a sum of the product of the common-mode current I and the resistance R and a threshold voltage of the transistor $M_{R1}/M_{R2}$. As the threshold voltage Vth of the transistor $M_{R1}/M_{R2}$ can be designed to be equal to 0.7 volt, the amplifier 322 can serve as a MIPI D-PHY and subLVDS combo receiver front-end circuit.

Figure 5:
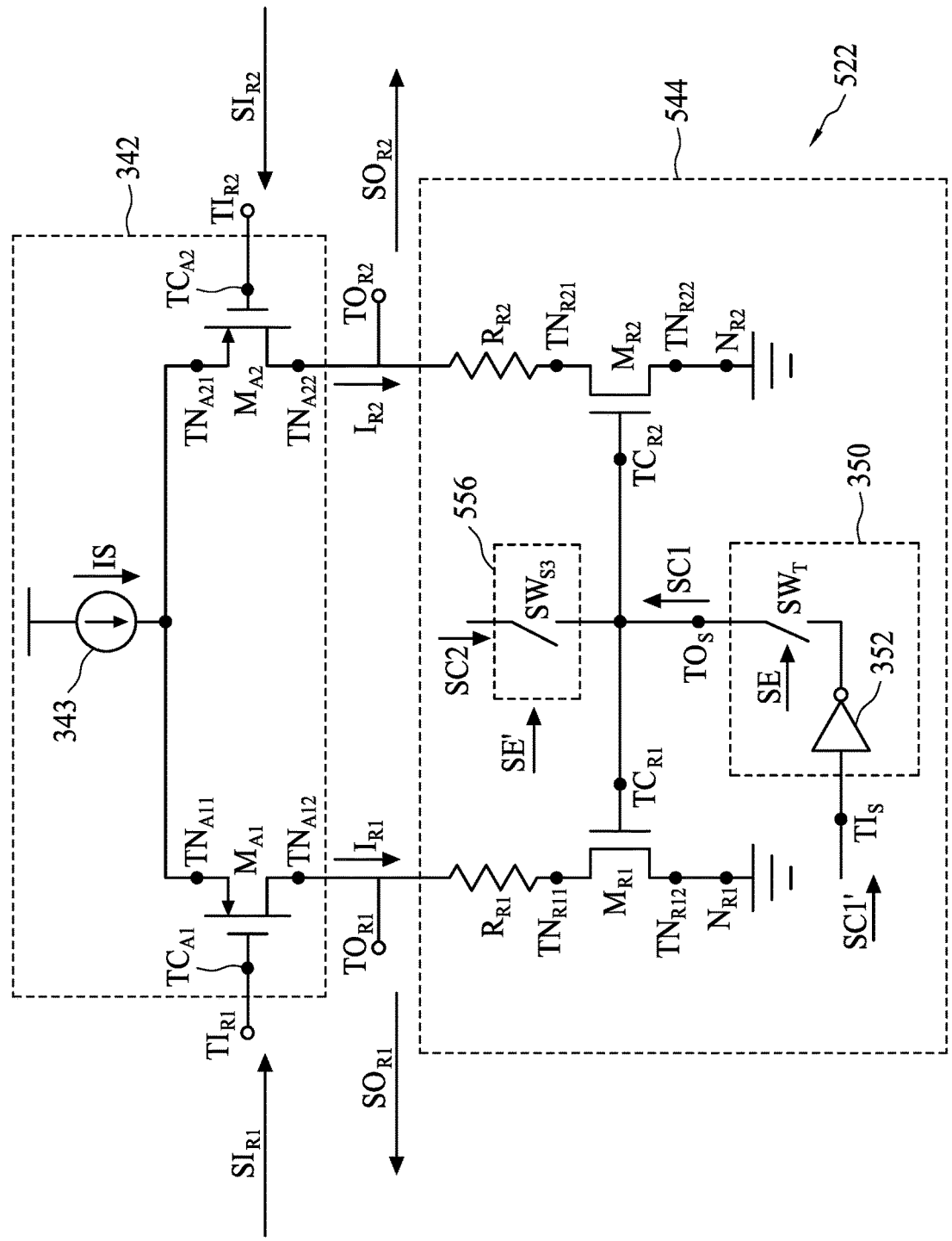
FIG. 5 illustrates another implementation of the amplifier shown in FIG. 2 in accordance with some embodiments of the present disclosure.

FIG. 5 illustrates another implementation of the amplifier 222 shown in FIG. 2 in accordance with some embodiments of the present disclosure. The circuit structure of the amplifier 522 is similar to that of the amplifier 322 shown in FIG. 3 except for a switch circuit 556 of a load circuit 544. The switch circuit 556 includes a switch $SW_{S3}$ which is selectively coupled between the control signal SC2 and the control terminal $TC_{R1}/TC_{R2}$. The control signal SC2 can be an adjustable or fixed voltage supplied by a voltage generator such as a voltage regulator or a low dropout regulator (LDO). When the signal output terminal $TO_S$ is in the low impedance state, the switch $SW_{S3}$ is switched off to disconnect the control signal SC2 from the control terminal $TC_{R1}/TC_{R2}$. When the signal output terminal $TO_S$ is in the high impedance state, the switch $SW_{S3}$ is switched on to couple the control signal SC2 to the control terminal $TC_{R1}/TC_{R2}$. As those skilled in the art should understand the operation of the amplifier 522 after reading the paragraphs directed to FIG. 1 to FIG. 4B, similar description is not repeated here for brevity.

Figure 6:
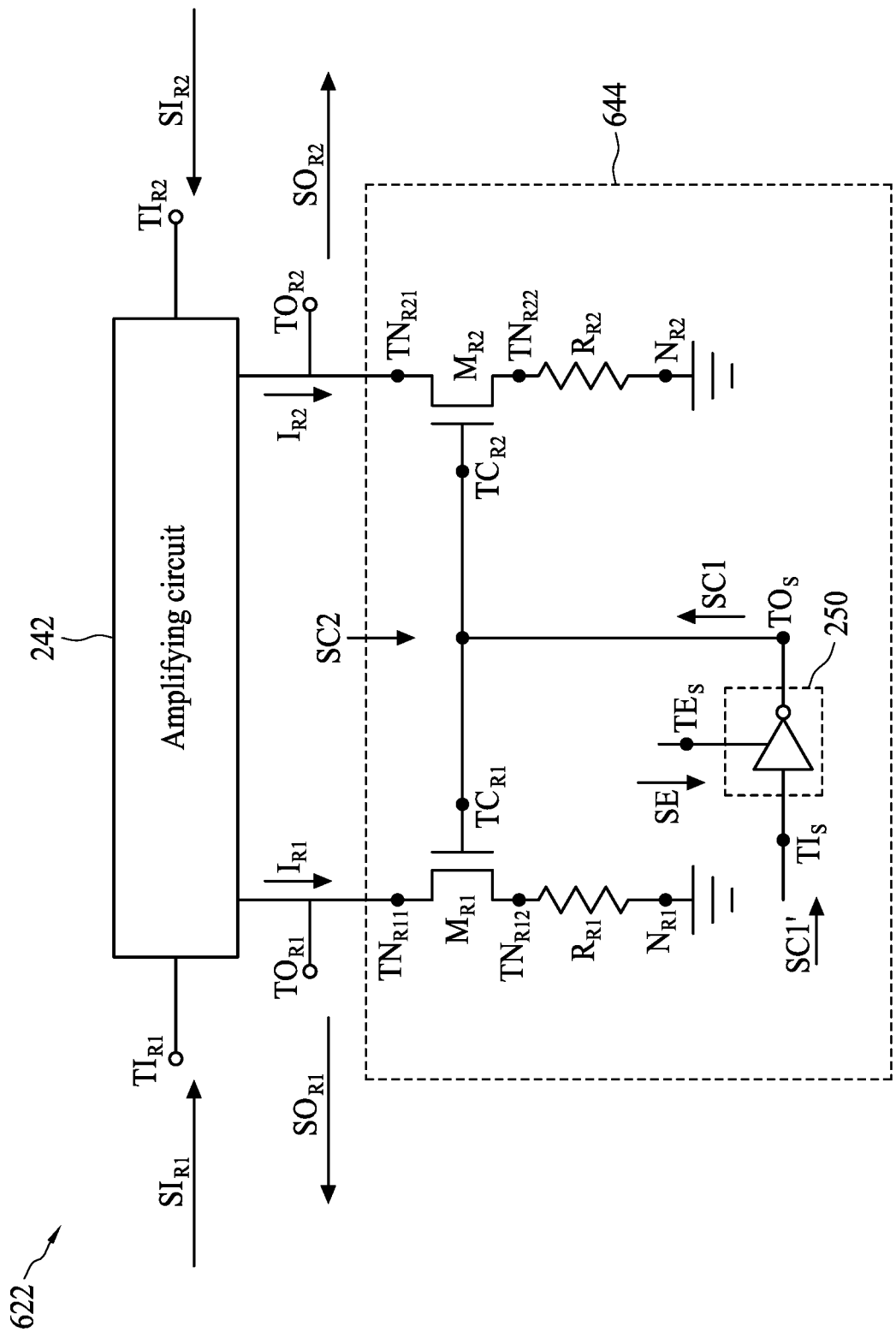
FIG. 6 illustrates another implementation of at least a portion of the receiver circuit shown in FIG. 1 in accordance with some embodiments of the present disclosure.

It is worth noting that the arrangements of the resistive elements and transistors shown in FIG. 2 though FIG. 5 are provided for illustrative purposes only, and are not intended to limit the scope of the present disclosure. Referring to FIG. 6, another implementation of at least a portion of the receiver circuit 122 shown in FIG. 1 is illustrated in accordance with some embodiments of the present disclosure. The circuit structure of the amplifier 622 is similar to that of the amplifier 222 shown in FIG. 2 except that each of the resistive elements $R_{R1}$ and $R_{R2}$ of the load circuit 644 is coupled between a transistor and a connection node. In the present embodiment, the connection terminal $TN_{R12}$ is coupled to the connection node $N_{R1}$ through the resistive element $R_{R1}$, and the connection terminal $TN_{R11}$ is coupled to the amplifier output terminal $TO_{R1}$. Also, the connection terminal $TN_{R22}$ is coupled to the connection node $N_{R2}$ through the resistive element $R_{R2}$, and the connection terminal $TN_{R21}$ is coupled to the amplifier output terminal $TO_{R2}$. The amplifier 622 can employ the circuit structures and operations described with reference to FIG. 2 to FIG. 5. As those skilled in the art should understand the operation of the amplifier 622 after reading the paragraphs directed to FIG. 1 to FIG. 5, further description is omitted here for brevity.

Figure 7:
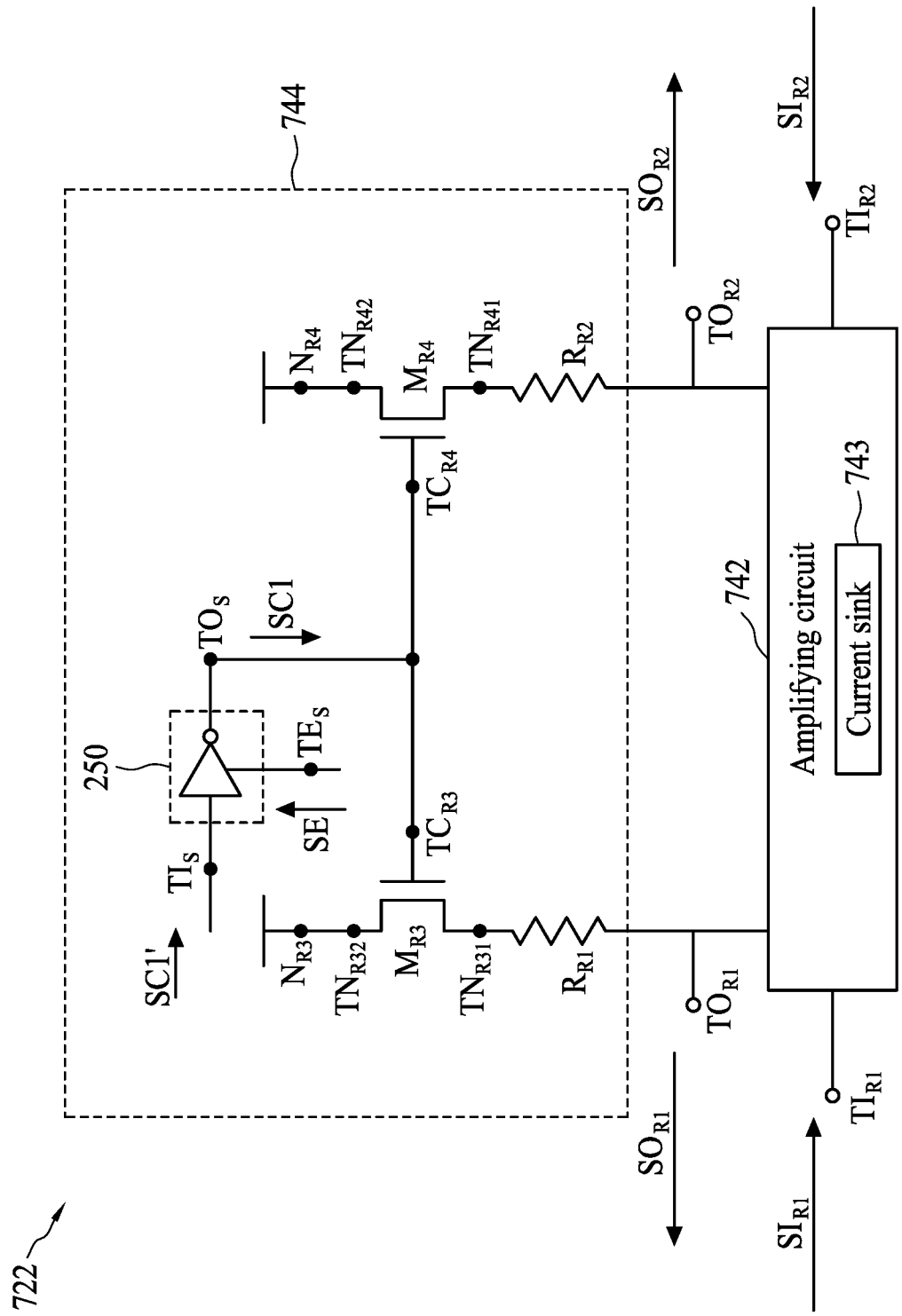
FIG. 7 is a diagram illustrating another implementation of at least a portion of the receiver circuit shown in FIG. 1 in accordance with some embodiments of the present disclosure.

FIG. 7 is a diagram illustrating another implementation of at least a portion of the receiver circuit 122 shown in FIG. 1 in accordance with some embodiments of the present disclosure. The circuit structure of the amplifier 722 is similar to that of the amplifier 222 shown in FIG. 2 except that transistors $M_{R3}$ and $M_{R4}$ of a load circuit 744 can be implemented by p-channel transistors instead of n-channel transistors. Accordingly, an amplifying circuit 742 can be configured as a differential pair including a current sink 743. The transistor $M_{R3}$ has a control terminal $TC_{R3}$, a connection terminal $TN_{R31}$ and a connection terminal $TN_{R32}$. The connection terminal $TN_{R31}$ is coupled to the amplifier output terminal $TO_{R1}$ through the resistive element $R_{R1}$, and the connection terminal $TN_{R32}$ is coupled to a connection node $N_{R3}$. The transistor $M_{R4}$ has a control terminal $TC_{R4}$, a connection terminal $TN_{R41}$ and a connection terminal $TN_{R42}$. The connection terminal $TN_{R41}$ is coupled to the amplifier output terminal $TO_{R2}$ through the resistive element $R_{R2}$, and the connection terminal $TN_{R42}$ is coupled to a connection node $N_{R4}$. Each of the connection nodes $N_{R3}$ and $N_{R4}$ can be coupled to a reference voltage such as a supply voltage. The amplifier 722 can employ similar circuit structures and operations as those described with reference to FIG. 2 to FIG. 6. As those skilled in the art should understand the operation of the amplifier 722 after reading the paragraphs directed to FIG. 1 to FIG. 6, further description is omitted here for brevity.

Figure 8:
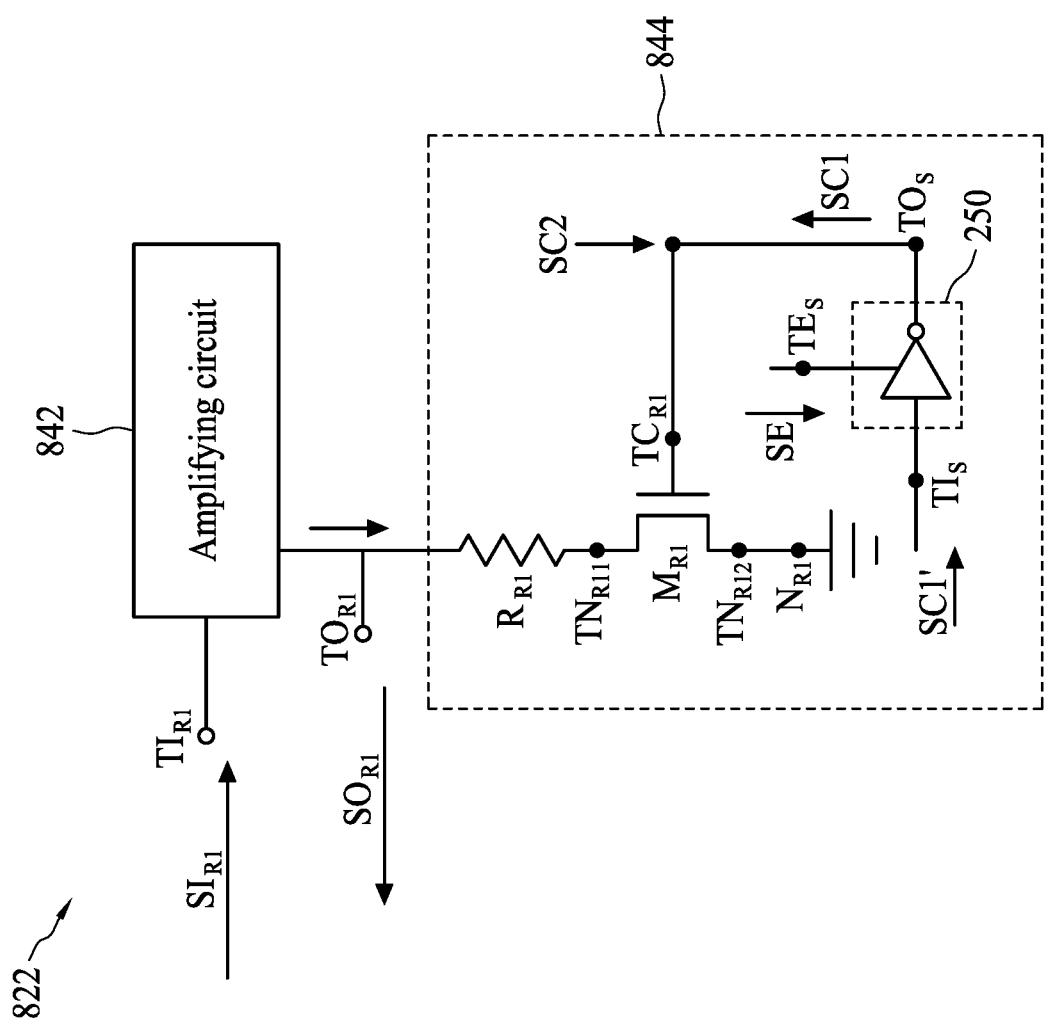
FIG. 8 is a diagram illustrating another implementation of at least a portion of the receiver circuit shown in FIG. 1 in accordance with some embodiments of the present disclosure.

FIG. 8 is a diagram illustrating another implementation of at least a portion of the receiver circuit 122 shown in FIG. 1 in accordance with some embodiments of the present disclosure. The circuit structure of the amplifier 822 is similar to that of the amplifier 222 shown in FIG. 2 except that the amplifier 822 utilize a single-ended structure rather than a differential structure of the load circuit 244 shown in FIG. 2. For example, an amplifying circuit 842 of the amplifier 822 is coupled between the amplifier input terminal $TI_{R1}$ and the amplifier output terminal $TO_{R1}$. A load circuit 844 of the amplifier 822 may include the resistive element $R_{R1}$, the transistor $M_{R1}$ and the tristate control circuit 250. The amplifier 822 can employ similar circuit structures and operations as those described with reference to FIG. 2 to FIG. 7. As those skilled in the art should understand the operation of the amplifier 822 after reading the paragraphs directed to FIG. 1 to FIG. 7, further description is omitted here for brevity.

Figure 9:
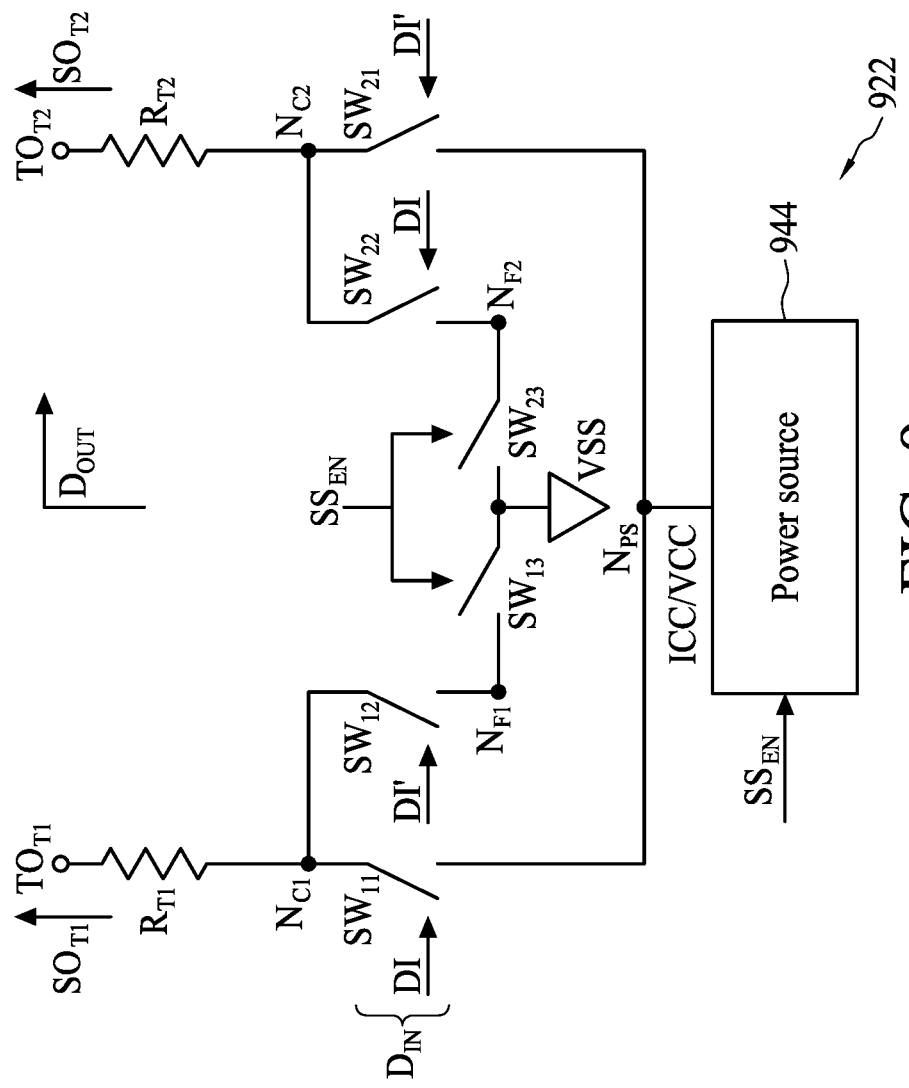
FIG. 9 is a diagram illustrating an implementation of at least a portion of the transmitter circuit shown in FIG. 1 in accordance with some embodiments of the present disclosure.

FIG. 9 is a diagram illustrating an implementation of at least a portion of the transmitter circuit 124 shown in FIG. 1 in accordance with some embodiments of the present disclosure. The driver circuit 922 can be, but is not limited to, an embodiment of a front-end circuit of the transmitter circuit 124 shown in FIG. 1. The driver circuit 922 is configured to receive a data input $D_{IN}$ to generate a data output $D_{OUT}$. In the present embodiment, the driver circuit 922 can be implemented as a differential driver, which includes a pair of output terminals $TO_{T1}$ and $TO_{T2}$, a plurality of switches $SW_{11}$-$SW_{13}$ and $SW_{21}$-$SW_{23}$, and a power source 944. The output terminals $TO_{T1}$ and $TO_{T2}$ are configured to output the data output $D_{OUT}$. The data output $D_{OUT}$ includes, but is not limited to, a pair of differential output signals $SO_{T1}$ and $SO_{T2}$, each of which can be an embodiment of the data signal DS1'/DS2' shown in FIG. 1.

The switch $SW_{11}$ is selectively coupled between the output terminal $TO_{T1}$ and a power supply node $N_{PS}$ according to the data input $D_{IN}$. The switch $SW_{12}$ is selectively coupled between the output terminal $TO_{T1}$ and a reference node $N_{F1}$ according to the data input $D_{IN}$. The switch $SW_{13}$ is selectively coupled between the reference node $N_{F1}$ and a reference voltage VSS such as a ground voltage. Similarly, the switch $SW_{21}$ is selectively coupled between the output terminal $TO_{T2}$ and the power supply node $N_{PS}$ according to the data input $D_{IN}$. The switch $SW_{22}$ is selectively coupled between the output terminal $TO_{T2}$ and a reference node $N_{F2}$ according to the data input $D_{IN}$. The switch $SW_{23}$ is selectively coupled between the reference node $N_{F2}$ and the reference voltage VSS.

The switches $SW_{11}$ and $SW_{12}$ may operate in a complementary manner. For example, when one of the switches $SW_{11}$ and $SW_{12}$ is switched on, the other of the switches $SW_{11}$ and $SW_{12}$ is switched off. In the present embodiment, the data input $D_{IN}$ may include a data signal DI and a data signal DI', wherein the data signals DI and DI' may be inverted with respect to each other, or non-overlapping signals. The switch $SW_{11}$ can be controlled by the data signal DI, while the switch $SW_{12}$ can be controlled by the data signal DI'. Similarly, the switches $SW_{21}$ and $SW_{22}$ may operate in a complementary manner, wherein when one of the switches $SW_{21}$ and $SW_{22}$ is switched on, the other of the switches $SW_{21}$ and $SW_{22}$ is switched off. Additionally or alternatively, the switches $SW_{11}$ and $SW_{21}$ may operate in a complementary manner, wherein when one of the switches $SW_{11}$ and $SW_{21}$ is switched on, the other of the switches $SW_{11}$ and $SW_{21}$ is switched off. By way of example but not limitation, the switch $SW_{21}$ can be controlled by the data signal DI', while the switch $SW_{22}$ can be controlled by the data signal DI.

The power source 944 is configured to selectively provide one of a supply voltage signal VCC and a supply current signal ICC to the power supply node $N_{PS}$. In the present embodiment, when the power source 944 is configured to provide the supply voltage signal VCC, each of the switches $SW_{13}$ and $SW_{23}$ is switched on. When the power source 944 is configured to provide the supply current signal ICC, each of the switches $SW_{13}$ and $SW_{23}$ is switched off. By way of example but not limitation, the power source 944, the switch $SW_{13}$ and the switch $SW_{23}$ can be controlled according to a power switch signal $SS_{EN}$.

In operation, when the driver circuit 922 is configured to output the data output $D_{OUT}$ compliant with a first interface standard, the power source 944 may provide the supply voltage signal VCC according to the power switch signal $SS_{EN}$, and the switches $SW_{13}$ and $SW_{23}$ may be switched on according to the power switch signal $SS_{EN}$. The driver circuit 922 can act as a voltage mode driver to output the data output $D_{OUT}$ compliant with the first interface standard. When the driver circuit 922 is configured to output the data output $D_{OUT}$ compliant with a second interface standard different from the first interface standard, the power source 944 may provide the supply current signal ICC according to the power switch signal $SS_{EN}$, and the switches $SW_{13}$ and $SW_{23}$ may be switched off according to the power switch signal $SS_{EN}$. The driver circuit 922 can act as a current mode driver to output the data output $D_{OUT}$ compliant with the second interface standard. As a result, the driver circuit 922 can operate in a voltage drive mode or a current drive mode to support multiple interface standards. Further description is provided later.

In the present embodiment, the driver circuit 922 may further include a plurality of resistive elements $R_{T1}$ and $R_{T2}$. The resistive element $R_{T1}$ is coupled between the output terminal $TO_{T1}$ and a connection node $N_{C1}$, such that each of the switch $SW_{11}$ and the switch $SW_{12}$ is coupled to the resistive element $R_{T1}$ through the connection node $N_{C1}$. Similarly, the resistive element $R_{T2}$ is coupled between the output terminal $TO_{T2}$ and a connection node $N_{C2}$, such that each of the switch $SW_{21}$ and the switch $SW_{22}$ is coupled to the resistive element $R_{T2}$ through the connection node $N_{C2}$. In some embodiments, respective resistances of the resistive elements $R_{T1}$ and $R_{T2}$ can be designed to match a termination element (not shown) which may be located in a receiver side such as the receive device 130 shown in FIG. 1.

To facilitate understanding of the present disclosure, some embodiments are given in the following for further description of the signal transmission scheme. Those skilled in the art should appreciate that other embodiments employing the driver circuit 922 shown in FIG. 9 are also within the contemplated scope of the present disclosure.

Figure 10:
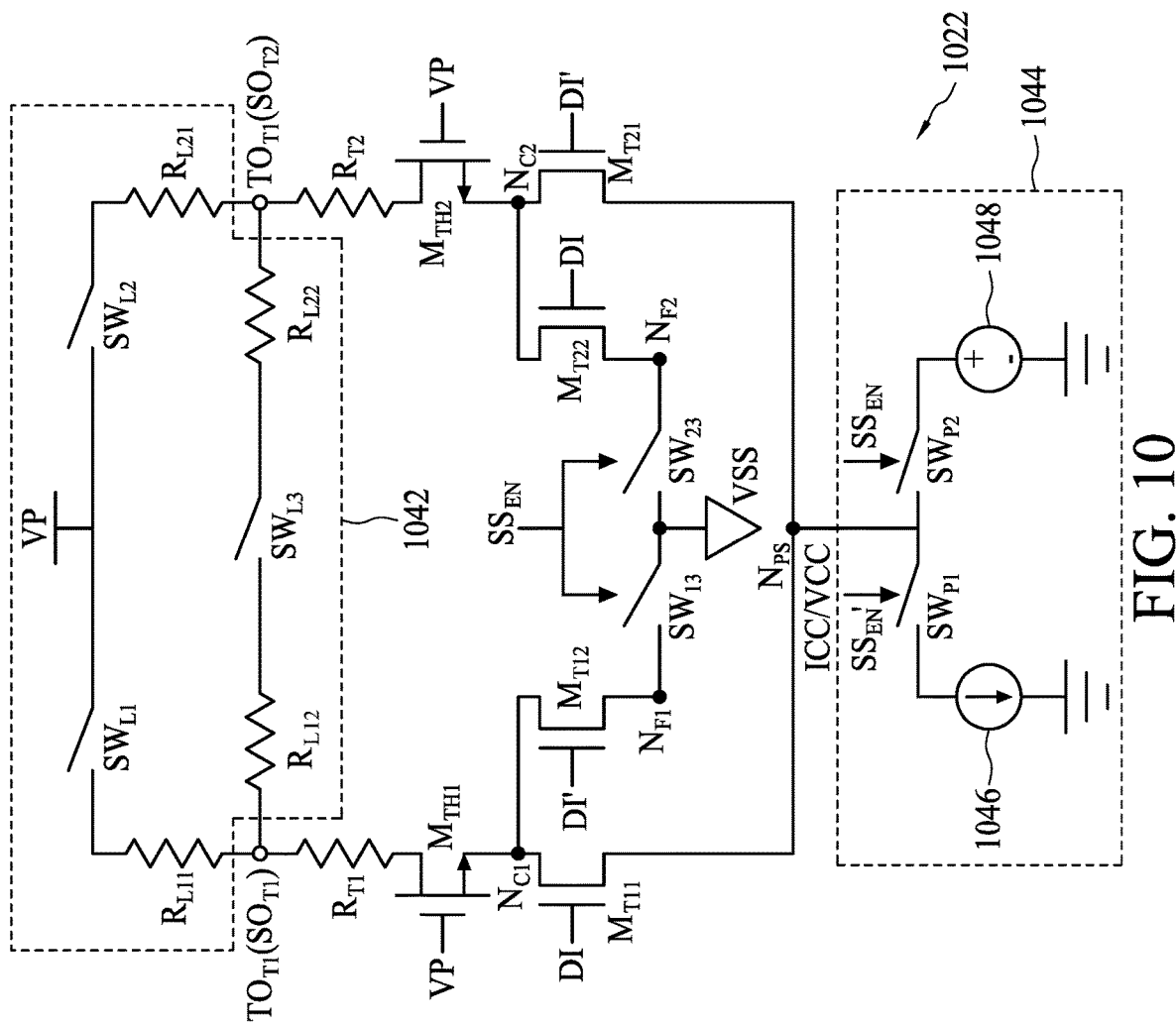
FIG. 10 illustrates an implementation of the driver circuit shown in FIG. 9 in accordance with some embodiments of the present disclosure.

FIG. 10 illustrates an implementation of the driver circuit 922 shown in FIG. 9 in accordance with some embodiments of the present disclosure. In the present embodiment, the driver circuit 1022 includes the output terminals $TO_{T1}$ and $TO_{T2}$, the switches $SW_{13}$ and $SW_{23}$, and the resistive elements $R_{T1}$ and $R_{T2}$ shown in FIG. 9. The driver circuit 1022 further includes, but is not limited to, a plurality of transistors $M_{T11}$, $M_{T12}$, $M_{T22}$, $M_{TH1}$ and $M_{TH2}$, a load circuit 1042 and a power source 1044. The transistors $M_{T11}$, $M_{T12}$, $M_{T21}$ and $M_{T22}$ can be embodiments of the switches $SW_{11}$, $SW_{12}$, $SW_{21}$ and $SW_{22}$ shown in FIG. 9 respectively. The power source 1044 can be an embodiment of the power source 944 shown in FIG. 9.

The transistor $M_{TH1}$, selectively coupled between the resistive element $R_{T1}$ and the connection node $N_{C1}$, is configured to provide a voltage drop thereacross during driving operation. The transistor $M_{TH2}$, selectively coupled between the resistive element $R_{T2}$ and the connection node $N_{C2}$, is configured to provide a voltage drop thereacross during driving operation.

The load circuit 1042 is configured to selectively couple a predetermined voltage signal VP to the output terminals $TO_{T1}$, and $TO_{T2}$. The load circuit 1042 includes, but is not limited to, a plurality of resistive elements $R_{L11}$, $R_{L12}$, $R_{L21}$, and $R_{L22}$, and a plurality of switches $SW_{L1}$-$SW_{L3}$. Each of the resistive elements $R_{L11}$ and $R_{L12}$ is coupled to the output terminal $TO_{T1}$, and each of the resistive elements $R_{L21}$ and $R_{L22}$ is coupled to the output terminal $TO_{T2}$. The switch $SW_{L1}$ is selectively coupled between the resistive element $R_{L11}$ and the predetermined voltage signal VP. The switch $SW_{L2}$ is selectively coupled between the resistive element $R_{L21}$ and the predetermined voltage signal VP. The switch $SW_{L3}$ is selectively coupled between the output terminal $TO_{T1}$ and the output terminal $TO_{T2}$. In the present embodiment, when the switch $SW_{13}$/$SW_{23}$ is switched on, each of the switches $SW_{L1}$-$SW_{L3}$ may be switched off. When the switch $SW_{13}$/$SW_{23}$ is switched off, each of the switches $SW_{L1}$-$SW_{L3}$ may be switched on.

The power source 1044 includes, but is not limited to, a current source 1046, a voltage source 1048, and a plurality of switches $SW_{P1}$ and $SW_{P2}$. The current source 1046 is configured to provide the supply current signal ICC. The voltage source 1048 is configured to provide the supply voltage signal VCC. The switch $SW_{P1}$ is configured to couple the current source 1046 to the power supply node $N_{PS}$ according to the power switch signal $SS_{EN}$, and the switch $SW_{P2}$ is configured to couple the voltage source 1048 to the power supply node $N_{PS}$ according to the power switch signal $SS_{EN}$, wherein when one of the switches $SW_{P1}$ and $SW_{P2}$ is switched on, the other of the switches $SW_{P1}$ and $SW_{P2}$ is switched off. By way of example but not limitation, the switch $SW_{P1}$ is controlled by an inverted signal $SS_{EN}'$ of the power switch signal $SS_{EN}$, while the switch $SW_{P1}$ is controlled the power switch signal $SS_{EN}$. Those skilled in the art will recognize that the power source 1044 may be implemented by other types of power sources capable of providing a supply voltage signal and a supply current signal without departing from the scope of the present disclosure.

Advantages of the driver circuit 1022 are described with reference to subLVDS standard and MIPI D-PHY standard in the following embodiments. However, this is for illustrative purposes only, and is not intended to be a limitation of the present disclosure. The driver circuits disclosed in the present disclosure are applicable to, but not limited to, multiple interface standards in addition to subLVDS standard and MIPI-PHY standard.

Figure 11A:
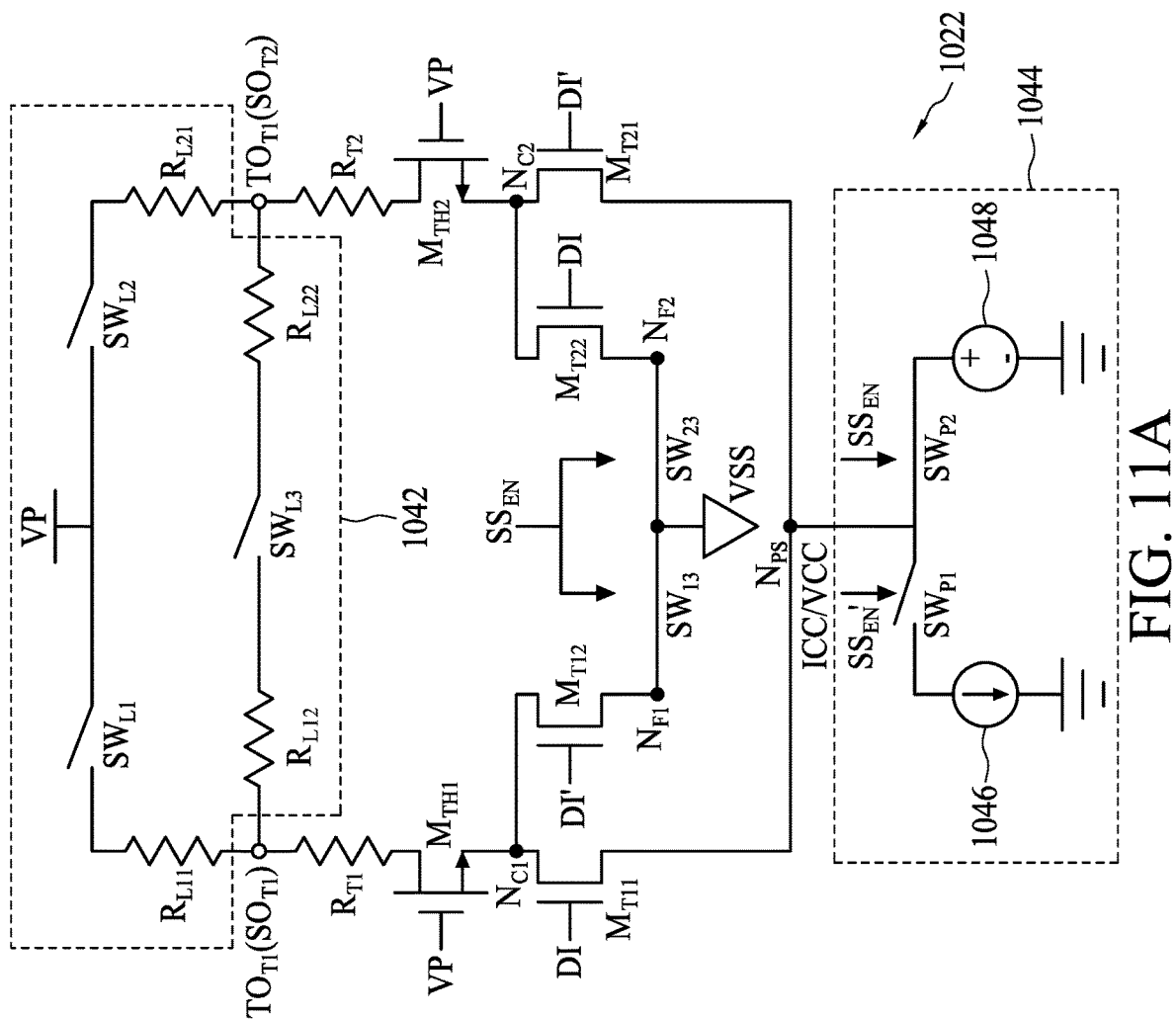
FIG. 11A is a diagram illustrating exemplary operation in a first operating mode of the driver circuit shown in FIG. 10 in accordance with some embodiments of the present disclosure.

FIG. 11A is a diagram illustrating exemplary operation in a first operating mode of the driver circuit 1022 shown in FIG. 10 in accordance with some embodiments of the present disclosure. In the present embodiment, the first operating mode can be, but is not limited to, a MIPI D-PHY mode. In operation, the switches $SW_{P1}$ and $SW_{L1}$-$SW_{L3}$ are switched off according to the power switch signal $SS_{EN}$. The switches $SW_{P2}$, $SW_{13}$ and $SW_{23}$ are switched on according to the power switch signal $SS_{EN}$. In addition, each of the transistors $M_{TH1}$ and $M_{TH2}$ is turned on. For example, the predetermined voltage signal VP can be inputted to a control terminal, e.g. a gate terminal, of the transistor $M_{TH1}$/$M_{TH2}$. As a result, the driver circuit 1022 can act as a voltage mode driver for outputting the data output $D_{OUT}$. As the MIPI D-PHY standard specifies a nominal common-mode voltage of 0.2 volt, the voltage source 1048 can be configured to provide the supply voltage signal VCC of 0.4 volt such that the output signals $SO_{T1}$ and $SO_{T2}$ may have a common-mode output voltage of 0.2 volt.

Please note that as a signal level of the supply voltage signal VCC can be designed according to different circuit requirements, the driver circuit 1022 operating in a voltage drive mode can support other interface standards different from the MIPI D-PHY standard.

Figure 11B:
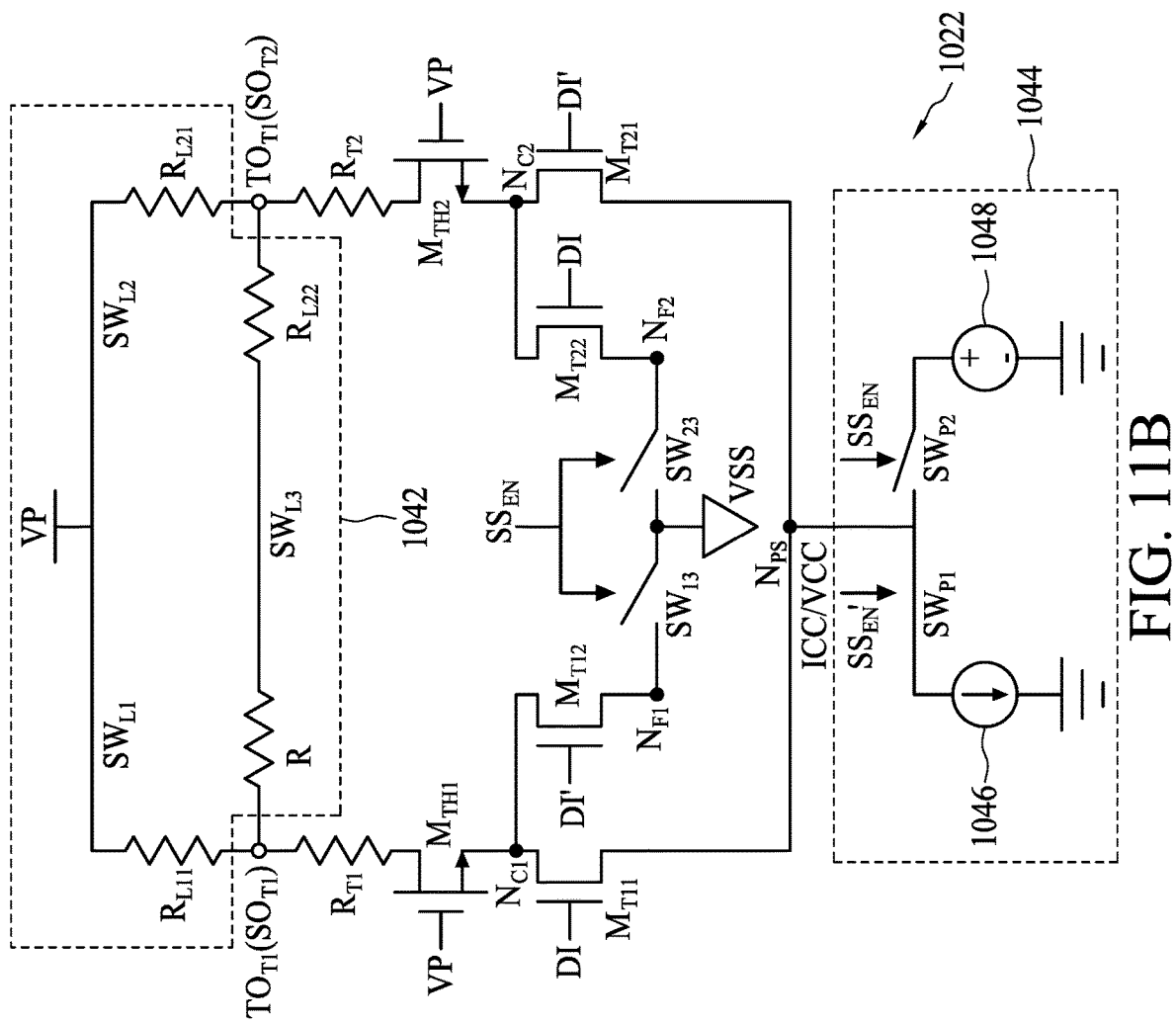
FIG. 11B is a diagram illustrating exemplary operation in a second operating mode of the driver circuit shown in FIG. 10 in accordance with some embodiments of the present disclosure.

Referring to FIG. 11B, exemplary operation in a second operating mode of the driver circuit 1022 shown in FIG. 10 is illustrated in accordance with some embodiments of the present disclosure. In the present embodiment, the second operating mode can be, but is not limited to, a subLVDS mode. In operation, the switches $SW_{P1}$ and $SW_{L1}$-$SW_{L3}$ are switched on according to the power switch signal $SS_{EN}$. The switch $SW_{P2}$, $SW_{13}$ and $SW_{23}$ are switched off according to the power switch signal $SS_{EN}$. In addition, each of the transistors $M_{TH1}$ and $M_{TH2}$ is turned on. As a result, the driver circuit 1022 can act as a current mode driver for outputting the data output $D_{OUT}$. As the subLVDS standard specifies a nominal common-mode voltage of 0.9 volt, the load circuit 1042 can be configured to couple the predetermined voltage signal VP of 1.8 volt to the output terminals $TO_{T1}$ and $TO_{T2}$, allowing the current source 1046 to draw current from the output terminals $TO_{T1}$ and $TO_{T2}$. In the present embodiment, the resistive elements $R_{L11}$ and $R_{L21}$ may have a same resistance, the resistive elements $R_{T1}$ and $R_{T2}$ may have a same resistance, and the resistive elements $R_{L12}$ and $R_{L22}$ may have a same resistance. Accordingly, the output signals $SO_{T1}$ and $SO_{T2}$ may have a common-mode output voltage of 0.9 volt when the resistance of the resistive element $R_{L11}$ is the same as that of the resistive element $R_{T1}$.

Please note that as a signal level of the predetermined voltage signal VP can be designed according to different circuit requirements, the driver circuit 1022 operating in a current drive mode can support other interface standards different from the subLVDS standard. Additionally or alternatively, as a ratio between the resistance of the resistive element $R_{L11}$ and the resistance of the resistive element $R_{T1}$ can be designed according to different circuit requirements, the driver circuit 1022 operating in a current drive mode can support other interface standards different from the subLVDS standard.

Furthermore, in some embodiments, each of the transistors $M_{TH1}$ and $M_{TH2}$ can be implemented by a thick gate oxide transistor, while each of the transistors $M_{T11}$, $M_{T12}$, $M_{T21}$ and $M_{T22}$ can be implemented by a thin gate oxide transistor. The specified dimensions for thick gate oxide transistors and thin gate oxide transistors depend on the semiconductor technology node used. For example, thin gate oxide 0.18 um transistors are powered by 1.8V, whereas thick gate oxide 0.35 um transistors are powered by 3.3V. As a thick gate oxide transistor can tolerate high voltages across gate to source terminals thereof and across gate to drain terminals as compared to a thin gate oxide transistor, the driver circuit 1022 employing the transistors $M_{TH1}$ and $M_{TH2}$ is able to support an interface standard which specifies a high nominal common-mode voltage.

Figure 12:
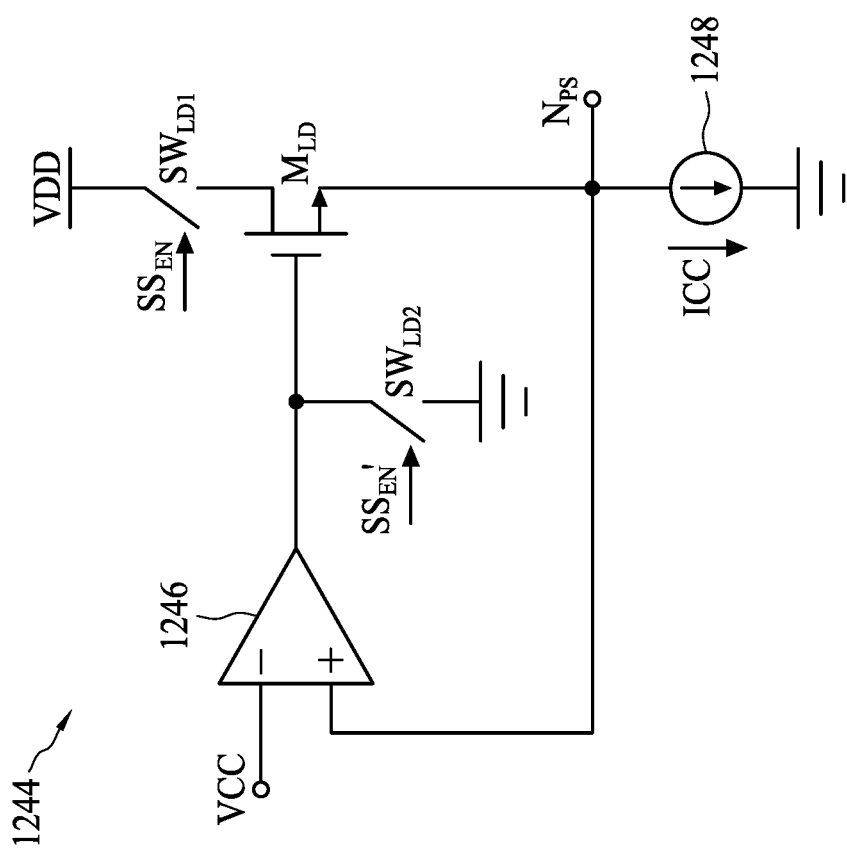
FIG. 12 illustrates an implementation of the power source shown in FIG. 10 is illustrated in accordance with some embodiments of the present disclosure.

Moreover, the structure of the power source 1044 shown in FIG. 10 through FIG. 11B is provided for illustrative purposes, and is not intended to limit the scope of the present disclosure. In some embodiments, the switches $SW_{P1}$ and $SW_{P2}$ of the power source 1044 shown in FIG. 10 may be replaced with a single pole double throw (SPDT) switch. In some embodiments, the current source 1046 and the voltage source 1048 may share one or more circuit elements. Referring to FIG. 12, an implementation of the power source 1044 shown in FIG. 10 is illustrated in accordance with some embodiments of the present disclosure. The power source 1244 includes, but is not limited to, an error amplifier 1246, a transistor $M_{LD}$, a current generator 1248, a switch $SW_{LD1}$ and a switch $SW_{LD2}$. A negative input terminal of the error amplifier 1246 is coupled to the supply voltage signal VCC, and a positive input terminal of the error amplifier 1246 is coupled to the power supply node $N_{PS}$. The current generator 1248 is configured to provide the current supply signal ICC. The switch $SW_{LD1}$ is selectively coupled between a reference voltage VDD and the transistor $M_{LD}$ according to the power switch signal $SS_{EN}$. The switch $SW_{LD2}$ is selectively coupled between an output terminal of the error amplifier 1246 and a ground voltage according to the inverted signal $SS_{EN}'$ of the power switch signal $SS_{EN}$.

In operation, when one of the switches $SW_{LD1}$ and $SW_{LD2}$ is switched on according to the power switch signal $SS_{EN}$, the other of the switches $SW_{LD1}$ and $SW_{LD2}$ is switched off according to the power switch signal $SS_{EN}$. By way of example but not limitation, the switch $SW_{LD1}$ is controlled by the power switch signal $SS_{EN}$, while the switch $SW_{LD2}$ is controlled by the inverted signal $SS_{EN}'$ of the power switch signal $SS_{EN}$. As a result, when the driver circuit 1022 shown in FIG. 10 operates in a voltage drive mode, the power source 1244 can providing the supply voltage signal VCC by switching on the switch $SW_{LD1}$ and switching off the switch $SW_{LD2}$. When the driver circuit 1022 shown in FIG. 10 operates in a current drive mode, the power source 1244 can providing the supply current signal ICC by switching off the switch $SW_{LD1}$ and switching on the switch $SW_{LD2}$.

Figure 13:
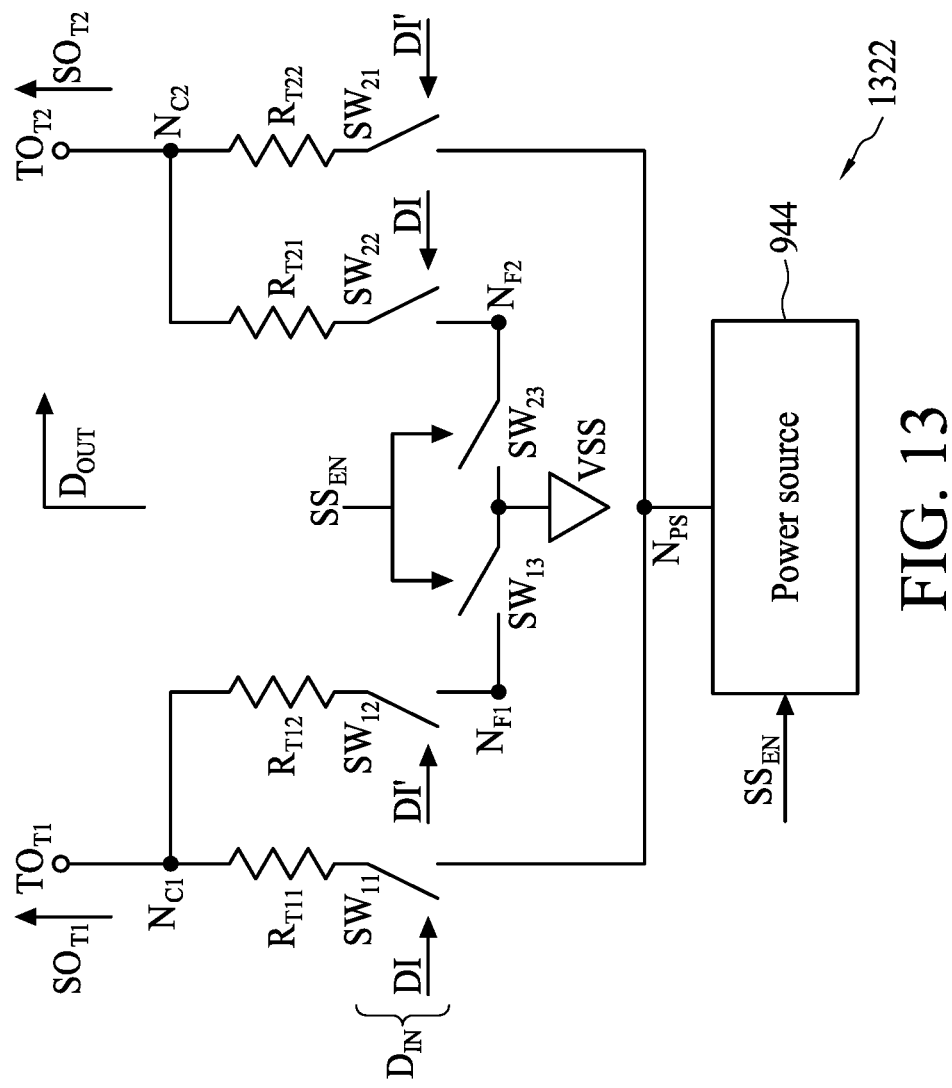
FIG. 13 illustrates another implementation of at least a portion of the transmitter circuit shown in FIG. 1 is illustrated in accordance with some embodiments of the present disclosure.

It is worth noting that the arrangements of the resistive elements and transistors shown in FIG. 9 to FIG. 11B are provided for illustrative purposes only, and are not intended to limit the scope of the present disclosure. Referring to FIG. 13, another implementation of at least a portion of the transmitter circuit 124 shown in FIG. 1 is illustrated in accordance with some embodiments of the present disclosure. The circuit structure of the driver circuit 1322 is similar to that of the amplifier 922 shown in FIG. 9 except that the switches $SW_{11}$ and $SW_{12}$ are coupled to the output terminal $TO_{T1}$ through different resistive elements $R_{T11}$ and $R_{T12}$ respectively, and that the switches $SW_{21}$ and $SW_{22}$ are coupled to the output terminal $TO_{T2}$ through different resistive elements $R_{T21}$ and $R_{T22}$ respectively. The driver circuit 1322 can employ the circuit structures and operations described with reference to FIG. 9 to FIG. 12. As those skilled in the art should understand the operation of the driver circuit 1322 after reading the paragraphs directed to FIG. 1 and FIG. 9 to FIG. 12, further description is omitted here for brevity.

Figure 14:
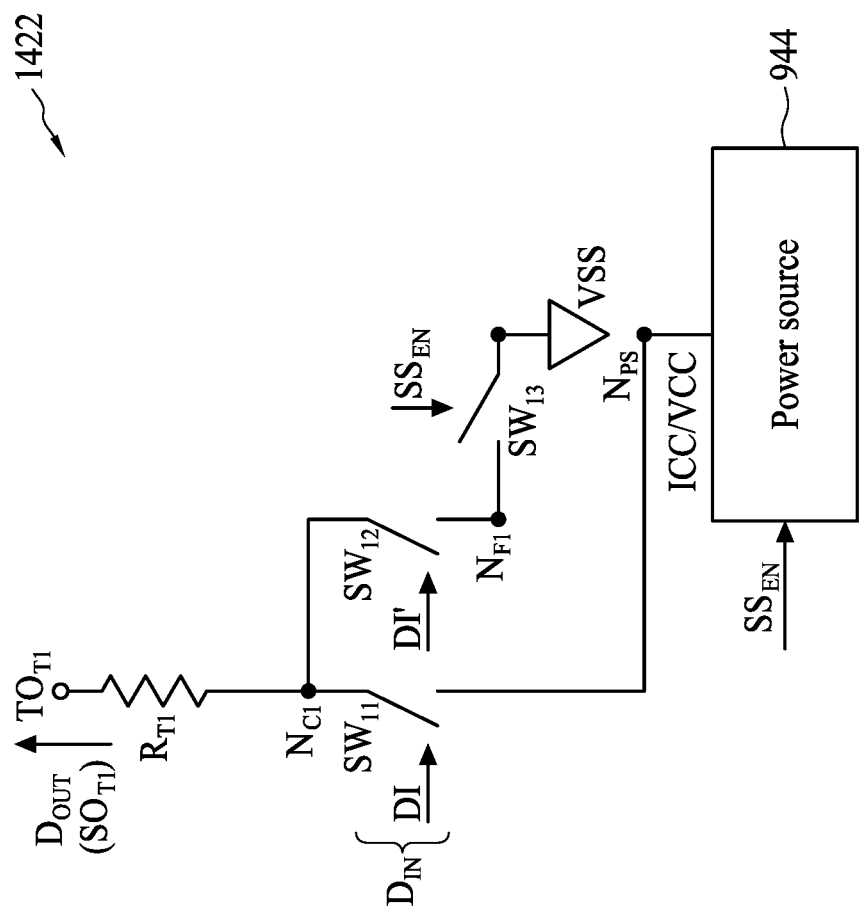
FIG. 14 is a diagram illustrating another implementation of at least a portion of the transmitter circuit shown in FIG. 1 in accordance with some embodiments of the present disclosure.

FIG. 14 is a diagram illustrating another implementation of at least a portion of the transmitter circuit 124 shown in FIG. 1 in accordance with some embodiments of the present disclosure. The circuit structure of the driver circuit 1422 is similar to that of the driver circuit 922 shown in FIG. 9 except that the driver circuit 1422 utilizes a single-ended structure rather than a differential structure shown in FIG. 9. The driver circuit 1422 can employ similar circuit structures and operations as those described with reference to FIG. 9 to FIG. 13. As those skilled in the art should understand the operation of the amplifier 1422 after reading the paragraphs directed to FIG. 1 and FIG. 9 to FIG. 13, further description is omitted here for brevity.

With the use of a data transmission/reception scheme which supports multiple interface standards, a signal processing device such as an ISP chip can meet different common-mode voltage specifications at both a receiver side and a transmitter side. Also, compared with a signal processing device employing dedicated circuits for different interface standards, the signal processing device utilizing the proposed data transmission/reception scheme can have a relatively small circuit area, thereby reducing manufacturing costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A driver circuit for receiving a data input to generate a data output, the driver circuit comprising:
   a first output terminal, arranged for outputting the data output;
   a first switch, selectively coupled between the first output terminal and a power supply node according to the data input;
   a second switch, selectively coupled between the first output terminal and a first reference node according to the data input;
   a third switch, selectively coupled between the first reference node and a reference voltage; and
   a power source, configured to selectively provide one of a supply voltage signal and a supply current signal to the power supply node, wherein when the power source is configured to provide the supply voltage signal, the third switch is switched on; when the power source is configured to provide the supply current signal, the third switch is switched off.

2. The driver circuit of claim 1, wherein when one of the first switch and the second switch is switched on, the other of the first switch and the second switch is switched off.

3. The driver circuit of claim 1, further comprising:
   a resistive element, coupled between the first output terminal and a connection node, wherein each of the first switch and the second switch is coupled to the first resistive element through the connection node.

4. The driver circuit of claim 3, wherein the first switch is a thin gate oxide transistor; the driver circuit further comprises:
   a thick gate oxide transistor, selectively coupled between the resistive element and the connection node.

5. The driver circuit of claim 1, further comprising:
   a second output terminal, the first output terminal and the second output terminal serving as a pair of differential output terminals and arranged for outputting the output signal;
   a fourth switch, selectively coupled between the second output terminal and the power supply node according to the data input;
   a fifth switch, selectively coupled between the second output terminal and a second reference node according to the data input; and
   a sixth switch, selectively coupled between the second reference node and the reference voltage, wherein when the power source is configured to provide the supply voltage signal, the sixth switch is switched on; when the power source is configured to provide the supply current signal, the sixth switch is switched off;
   wherein when one of the first switch and the fourth switch is switched on, the other of the first switch and the fourth switch is switched off.

6. The driver circuit of claim 5, wherein when one of the first switch and the second switch is switched on, the other of the first switch and the second switch is switched off; when one of the fourth switch and the fifth switch is switched on, the other of the fourth switch and the fifth switch is switched off.

7. The driver circuit of claim 5, wherein the first switch is a first thin gate oxide transistor, and the fourth switch is a second thin gate oxide transistor; the driver circuit further comprises:
   a first resistive element, coupled between the first output terminal and a first connection node, wherein each of the first switch and the second switch is coupled to the first resistive element through the first connection node;
   a second resistive element, coupled between the second output terminal and a second connection node, wherein each of the fourth switch and the fifth switch is coupled to the second resistive element through the second connection node;
   a first thick gate oxide transistor, selectively coupled between the first resistive element and the first connection node; and
   a second thick gate oxide transistor, selectively coupled between the second resistive element and the second connection node, wherein a control terminal of the first thick gate oxide transistor and a control terminal of the second thick gate oxide transistor are coupled to a same voltage signal.

8. The driver circuit of claim 1, wherein the power source comprises:
   a current source, configured to provide the supply current signal;
   a voltage source, configured to provide the supply voltage signal;
   a fourth switch, selectively coupled between the power supply node and the current source; and
   a fifth switch, selectively coupled between the power supply node and the voltage source, wherein when one of the fourth switch and the fifth switch is switched on, the other of the fourth switch and the fifth switch is switched off.

9. The driver circuit of claim 1, wherein the power source comprises:
   a current generator, coupled to the power supply node, the current generator being configured to generate the supply current signal;
   an error amplifier, wherein a first input terminal of the error amplifier is coupled to the supply voltage signal, and a second input terminal of the error amplifier is coupled to the power supply node;
   a transistor, wherein a control terminal of the transistor is coupled to an output terminal of the error amplifier, and a first connection terminal of the transistor is coupled to the power supply node;
   a fourth switch, selectively coupled between a second connection terminal of the transistor and another reference voltage; and
   a fifth switch, selectively coupled between the control terminal of the transistor and a ground voltage, wherein when one of the fourth switch and the fifth switch is switched on, the other of the fourth switch and the fifth switch is switched off.

10. The driver circuit of claim 1, further comprising:
    a first resistive element, coupled between the first output terminal and the first switch; and
    a second resistive element, coupled between the first output terminal and the second switch.

11. A driver circuit for receiving a data input to generate a data output, the driver circuit comprising:
    a pair of differential output terminals, arranged for outputting the data output, wherein the pair of differential output terminals has a first output terminal and a second output terminal;
    a power source, configured to selectively provide one of a supply voltage signal and a supply current signal to a power supply node according to a power switch signal;
    a first switch, selectively coupled between the first output terminal and the power supply node according to the data input;

a second switch, selectively coupled between the first output terminal and a first reference node according to the data input;

a third switch, selectively coupled between the first reference node and a reference voltage according to the power switch signal;

a fourth switch, selectively coupled between the second output terminal and the power supply node according to the data input;

a fifth switch, selectively coupled between the second output terminal and a second reference node according to the data input; and a sixth switch, selectively coupled between the second reference node and the reference voltage.

12. The driver circuit of claim 11, wherein when the power source is configured to provide the supply voltage signal according to the power switch signal, each of the third switch and the sixth switch is switched on according to the power switch signal; when the power source is configured to provide the supply current signal according to the power switch signal, each of the third switch and the sixth switch is switched off according to the power switch signal.

13. The driver circuit of claim 11, further comprising:

a first resistive element, coupled between the first output terminal and a first connection node, wherein each of the first switch and the second switch is coupled to the first resistive element through the first connection node; and a second resistive element, coupled between the second output terminal and a second connection node, wherein each of the fourth switch and the fifth switch is coupled to the second resistive element through the second connection node.

14. The driver circuit of claim 13, wherein each of the first switch, the second switch, the third switch and the fourth switch is a thin gate oxide transistor; the driver circuit further comprises:

a first thick gate oxide transistor, selectively coupled between the first resistive element and the first connection node; and a second thick gate oxide transistor, selectively coupled between the second resistive element and the second connection node.

15. The driver circuit of claim 14, wherein a control terminal of the first thick gate oxide transistor and a control terminal of the second thick gate oxide transistor are coupled to a same voltage signal.

16. The driver circuit of claim 11, wherein when one of the first switch and the second switch is switched on, the other of the first switch and the second switch is switched off; when one of the fourth switch and the fifth switch is switched on, the other of the fourth switch and the fifth switch is switched off.

17. The driver circuit of claim 11, wherein when one of the first switch and the fourth switch is switched on, the other of the first switch and the fourth switch is switched off.

18. The driver circuit of claim 11, wherein the power source comprises:

a current source, configured to provide the supply current signal;

a voltage source, configured to provide the supply voltage signal;

a seventh switch, selectively coupled between the power supply node and the current source according to the power switch signal; and an eighth switch, selectively coupled between the power supply node and the voltage source according to the power switch signal, wherein when one of the seventh switch and the eighth switch is switched on, the other of the seventh switch and the eighth switch is switched off.

19. The driver circuit of claim 11, wherein the power source comprises:

a current generator, coupled to the power supply node, the current generator being configured to generate the supply current signal;

an error amplifier, wherein a first input terminal of the error amplifier is coupled to the supply voltage signal, and a second input terminal of the error amplifier is coupled to the power supply node;

a transistor, wherein a control terminal of the transistor is coupled to an output terminal of the error amplifier, and a first connection terminal of the transistor is coupled to the power supply node;

a seventh switch, selectively coupled between a second connection terminal of the transistor and another reference voltage according to the power switch signal; and an eighth switch, selectively coupled between the control terminal of the transistor and a ground voltage according to the power switch signal, wherein when one of the seventh switch and the eighth switch is switched on, the other of the seventh switch and the eighth switch is switched off.

20. The driver circuit of claim 11, further comprising:

a first resistive element, coupled between the first output terminal and the first switch;

a second resistive element, coupled between the first output terminal and the second switch;

a third resistive element, coupled between the second output terminal and the fourth switch; and a fourth resistive element, coupled between the second output terminal and the fifth switch.

* * * * *